(12) United States Patent
Kobayashi

(10) Patent No.: US 10,836,264 B2
(45) Date of Patent: Nov. 17, 2020

(54) DRIVE SYSTEM

(71) Applicant: DENSO CORPORATION, Kariya (JP)

(72) Inventor: Hisaaki Kobayashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/432,063

(22) Filed: Jun. 5, 2019

(65) Prior Publication Data
US 2019/0288628 A1 Sep. 19, 2019

Related U.S. Application Data

(63) Continuation of application No. PCT/JP2017/040751, filed on Nov. 13, 2017.

(30) Foreign Application Priority Data

Dec. 5, 2016 (JP) .................. 2016-236147

(51) Int. Cl.
B60L 9/18 (2006.01)
B60L 53/20 (2019.01)
(Continued)

(52) U.S. Cl.
CPC ................. B60L 9/18 (2013.01); B60L 50/51 (2019.02); B60L 50/75 (2019.02); B60L 53/20 (2019.02);
(Continued)

(58) Field of Classification Search
CPC ...... H02M 7/53871; H02M 2001/0048; H02P 5/46; H02P 27/06
(Continued)

(56) References Cited

U.S. PATENT DOCUMENTS 8,220,574 B2 * 7/2012 Nozawa .................. H02P 27/06
180/65.275
2006/0164028 A1 7/2006 Welchko et al.
2014/0176034 A1 6/2014 Matsumura et al.

FOREIGN PATENT DOCUMENTS

JP H07-135797 A 5/1995
JP 2014-002081 A 1/2014
JP 2016-082620 A 5/2016

OTHER PUBLICATIONS

Feb. 13, 2018 International Search Report issued in International Patent Application No. PCT/JP2017/040751.

* cited by examiner

Primary Examiner — David Luo
(74) Attorney, Agent, or Firm — Oliff PLC

(57) ABSTRACT

A drive system includes a first inverter electrically connected to a first AC rotating electrical machine, a second inverter electrically connected to first end sides of phase coils constituting a second AC rotating electrical machine, a boost converter, and a third inverter electrically connected to a second end sides of phase coils and drives the second AC rotating electrical machine by transmitting electrical power between the third inverter and a second DC power source different from a first DC power source. The drive system is configured such that the second DC power source and the first AC rotating electrical machine are connected via a single connecting route. The drive system includes a processor that changes a control state of at least one of the first to third inverters and the boost converter based on a state of at least one of the first to third inverters, the boost converter, and the first and second DC power sources.

20 Claims, 15 Drawing Sheets

(51) Int. Cl.
*B60L 50/51* (2019.01)
*G01R 19/165* (2006.01)
*H02M 1/32* (2007.01)
*H02M 3/158* (2006.01)
*H02M 7/493* (2007.01)
*H02M 7/5387* (2007.01)
*H02P 5/46* (2006.01)
*H02P 27/06* (2006.01)
*H02M 7/797* (2006.01)
*H02M 7/48* (2007.01)
*B60L 50/75* (2019.01)
*H02M 1/00* (2006.01)

(52) U.S. Cl.
CPC ........ *G01R 19/16542* (2013.01); *H02M 1/32* (2013.01); *H02M 3/158* (2013.01); *H02M 7/48* (2013.01); *H02M 7/493* (2013.01); *H02M 7/53871* (2013.01); *H02M 7/797* (2013.01); *H02P 5/46* (2013.01); *H02P 27/06* (2013.01); *H02M 2001/007* (2013.01); *H02M 2001/0048* (2013.01); *H02M 2001/0077* (2013.01); *H02M 2001/327* (2013.01); *Y02T 10/7005* (2013.01); *Y02T 10/7225* (2013.01); *Y02T 10/7241* (2013.01)

(58) Field of Classification Search
USPC .................................... 318/139, 34
See application file for complete search history.

| VOLTAGE VECTOR | U PHASE | V PHASE | W PHASE |
|---|---|---|---|
| V0 | 0 | 0 | 0 |
| V1 | 1 | 0 | 0 |
| V2 | 1 | 1 | 0 |
| V3 | 0 | 1 | 0 |
| V4 | 0 | 1 | 1 |
| V5 | 0 | 0 | 1 |
| V6 | 1 | 0 | 1 |
| V7 | 1 | 1 | 1 |

0 : LOWER ARM SWITCH TURNED ON
1 : UPPER ARM SWITCH TURNED ON

FIG.11

Wsout=Wsmin

| Vsout [v]   | Vsmin | ... | Vsmax |
|-------------|-------|-----|-------|
| Loss1 [kw]  | L1A   | ... | L2B   |

Wsout=Wsmax

| Vsout [v]   | Vsmin | ... | Vsmax |
|-------------|-------|-----|-------|
| Loss1 [kw]  | L1C   | ... | L1D   |

FIG.12

Wsiv1=Ws1min

| Vsout [v]   | Vsmin | ... | Vsmax |
|-------------|-------|-----|-------|
| Loss2 [kw]  | L2A   | ... | L2B   |

Wsiv1=Ws1max

| Vsout [v]   | Vsmin | ... | Vsmax |
|-------------|-------|-----|-------|
| Loss2 [kw]  | L2C   | ... | L2D   |

FIG.13

| Wseg[kw]    | Wsemin | ⋯ | Wsemax |
|-------------|--------|---|--------|
| Losseg[kw]  | LegA   | ⋯ | LegB   |

FIG.14

Wsiv2=Ws2min

| Vsout[v]    | Vsmin | ⋯ | Vsmax |
|-------------|-------|---|-------|
| Lossiv2[kw] | Liv2A | ⋯ | Liv2B |
| Vsiv2[v]    | Vs2A  | ⋯ | Vs2B  |

⋰

Wsiv2=Ws2max

| Vsout[v]    | Vsmin | ⋯ | Vsmax |
|-------------|-------|---|-------|
| Lossiv2[kw] | Liv2C | ⋯ | Liv2D |
| Vsiv2[v]    | Vs2C  | ⋯ | Vs2D  |

FIG.15

Wsiv2=Ws2min, Vsiv2=Vs2min

| Wsiv3[kw] | Ws3min | ⋯ | Ws3max |
|-----------|--------|---|--------|
| Loss3[kw] | L3A    | ⋯ | L3B    |

⋰

Wsiv2=Ws2max, Vsiv2=Vs2max

| Wsiv3[kw] | Ws3min | ⋯ | Ws3max |
|-----------|--------|---|--------|
| Loss3[kw] | L3C    | ⋯ | L3D    |

FIG.20

| Loss1  | ... | ... | MAX | MAX |
|--------|-----|-----|-----|-----|
| Loss2  | ... | MIN | ... | ... |
| Loss3  | ... | ... | ... | ... |
| Wtotal | MIN | ... | 2nd | 3rd |
| Vsout  | ... | ... | ... | ... |

↑ SECOND EMBODIMENT

↑ WHEN FIRST INVERTER AND FIRST MOTOR GENERATOR ARE DETERMINED TO BE OVERHEATED

FIG.21

| Loss1  | ... | ... | MAX | MAX |
|--------|-----|-----|-----|-----|
| Loss2  | ... | MIN | ... | ... |
| Loss3  | ... | ... | ... | ... |
| Wtotal | MIN | ... | 2nd | 3rd |
| Vsout  | ... | ... | ... | ... |

↑ SECOND EMBODIMENT

↑ WHEN FIRST INVERTER AND FIRST POWER SOURCE ARE DETERMINED TO BE LOW TEMPERATURE

US 10,836,264 B2

DRIVE SYSTEM

CROSS-REFERENCE TO RELATED APPLICATION

This application is the U.S. bypass application of International Application No. PCT/JP2017/040751 filed Nov. 13, 2017 which designated the U.S. and claims priority to Japanese Patent Application No. 2016-236147, filed Dec. 5, 2016, the contents of which are incorporated herein by reference.

TECHNICAL FIELD

This specification relates to a drive system including an AC rotating electrical machine.

BACKGROUND

As such a type of drive system, there are known AC rotating electrical machines including open-delta type armature coils. In such a drive system, first ends of the two ends of phase coils constituting the AC rotating electrical machine are connected to a first DC power source via a first inverter. Second ends of the two ends of the phase coils of the AC rotating electrical machine are connected to a second DC power source different from the first DC power source via a second inverter. With the above-described drive system feeding electrical power from the two DC power sources to the AC rotating electrical machines, a large amount of electrical power can be fed to the AC rotating electrical machines.

SUMMARY

According to a first aspect, a drive system includes a first AC rotating electrical machine and a second AC electrical machine, further including a first inverter electrically connected to the first AC rotating electrical machine and driving the first AC rotating electrical machine; a second inverter electrically connected to a first end of the two ends of each phase coil constituting the second AC rotating electrical machine and driving the second AC rotating electrical machine; a boost converter including a power-source-side connector electrically connectable to a first DC power source and electrically connected to an inverter-side connector electrically connected to the first inverter via a first electrical path and the second inverter via a second electrical path, the boost converter stepping up an output voltage of the first DC power source and outputting the stepped up output voltage to the first inverter and the second inverter; and a third inverter electrically connected to a second end side of the two ends of each phase coil constituting the second AC rotating electrical machine and driving the second AC rotating electrical machine by transmitting electrical power between the third inverter and a second DC power source different from the first DC power source. According to the first aspect, the second DC power source and the first AC rotating electrical machine are configured to be connected via a single connecting path. According to the first aspect, the drive system further includes a processor that performs a process of changing a control state of at least one of the first inverter, the second inverter, the third inverter, and the boost converter based on the state of at least one of the first inverter, the second inverter, the third inverter, the boost converter, the first DC power source, and the second DC power source.

BRIEF DESCRIPTION OF THE DRAWINGS

The above-described object and other objects, features and advantages of the present disclosure will become more apparent from the following detailed description with reference to the accompanying drawings. In the accompanying drawings:

FIG. 11 is a diagram illustrating a map for calculating a first loss;

FIG. 12 is a diagram illustrating a map for calculating a second loss;

FIG. 13 is a diagram illustrating a map for calculating an engine loss;

FIG. 14 is a diagram illustrating a map for calculating a second inverter loss and a second inverter voltage;

FIG. 15 is a diagram illustrating a map for calculating a third loss;

FIG. 20 is a table illustrating a method of setting a converter voltage command value, etc. according to another embodiment; and FIG. 21 is a table illustrating a method of setting a converter voltage command value, etc. according to another embodiment.

DETAILED DESCRIPTION OF THE PREFERRED EMBODIMENTS

Figure 1:
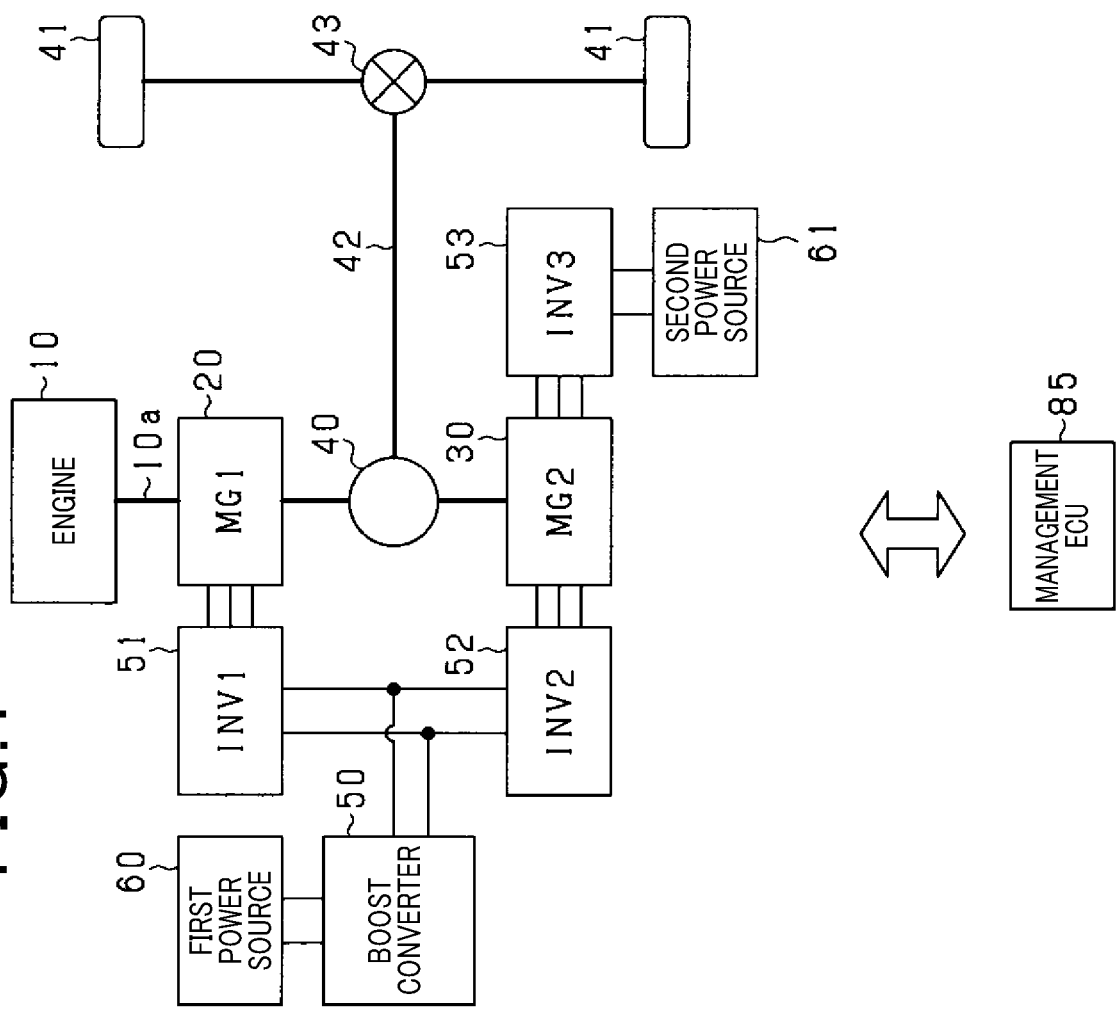
FIG. 1 is an overall configuration diagram of an in-vehicle drive system according to a first embodiment.

Besides the drive system described in the background, there is a drive system further including another AC rotating electrical machine. Such a drive system includes a first AC rotating electrical machine, a second AC rotating electrical machine, first to third inverters, as well as a fourth inverter.

In specific, first ends of the two ends of phase coils constituting the first AC rotating electrical machine are connected to a first DC power source via the first inverter, and first ends of the two ends of phase coils constituting the second AC rotating electrical machine are connected to a first DC power source via the second inverter.

Second ends of the two ends of the phase coils constituting the second AC rotating electrical machine are connected to the second DC power source via the third inverter, and second ends of the two ends of the phase coils constituting the first AC rotating electrical machine are connected to the second DC power source via the fourth inverter.

Here, when the electrical power generated by one of the first and second AC rotating electrical machines is fed to the other one of the rotating electrical machines, the potential difference across the electrical path connecting the first AC rotating electrical machine and the second AC rotating electrical machine may be large. In such a case, a large current flows through the electrical path, and loss occurring due to the current flowing through the electrical path may increase.

In a drive system including the first and second AC rotating electrical machines, current circulation may occur. Current circulation is the flow of a current in a closed circuit including the first to fourth inverters and the phase coils of the first and second AC rotating electrical machines. Current circulation may occur, for example, when electrical power generated at the first and second AC rotating electrical machines is fed to the first DC power source to charge the first DC power source. In specific, for example, when the generation voltage of the second AC rotating electrical machine is lower than the generation voltage of the first AC rotating electrical machine, the current output from the first AC rotating electrical machine flows through the closed circuit, not the first DC power source, depending on the control states of the first to fourth inverters. When current circulation occurs, controllability of the control level of the first and second AC rotating electrical machines may decrease.

An embodiment provides a drive system that can reduces loss in the drive system and prevent reduction in controllability of the control level of the first and second AC rotating electrical machines.

According to a first aspect, a drive system includes a first AC rotating electrical machine and a second AC electrical machine, further including a first inverter electrically connected to the first AC rotating electrical machine and driving the first AC rotating electrical machine; a second inverter electrically connected to a first end of the two ends of each phase coil constituting the second AC rotating electrical machine and driving the second AC rotating electrical machine; a boost converter including a power-source-side connector electrically connectable to a first DC power source and electrically connected to an inverter-side connector electrically connected to the first inverter via a first electrical path and the second inverter via a second electrical path, the boost converter stepping up an output voltage of the first DC power source and outputting the stepped up output voltage to the first inverter and the second inverter; and a third inverter electrically connected to a second end side of the two ends of each phase coil constituting the second AC rotating electrical machine and driving the second AC rotating electrical machine by transmitting electrical power between the third inverter and a second DC power source different from the first DC power source. According to the first aspect, the second DC power source and the first AC rotating electrical machine are configured to be connected via a single connecting path. According to the first aspect, the drive system further includes a processor that performs a process of changing a control state of at least one of the first inverter, the second inverter, the third inverter, and the boost converter based on the state of at least one of the first inverter, the second inverter, the third inverter, the boost converter, the first DC power source, and the second DC power source.

According to the first aspect, the boost converter steps up the output voltage of the first DC power source fed via the power-source-side connector. The boost converter outputs the stepped-up voltage to the first inverter via the inverter-side connector and the first electrical path and the second inverter via the inverter-side connector and the second electrical path. Thus, the voltages of the first and second electrical paths can be increased in comparison to the related art, which has a configuration in which a boost converter is not provided in the drive system and the voltage output from the first DC power source is directly applied to the first and second inverters. In this way, when generated power is fed from one of the first and second AC rotating electrical machines, the current flowing through the first and second electrical paths to feed the same generated power can be decreased in comparison to the related art. As a result, loss occurring due to a current flowing through the first and second electrical paths can be reduced.

Furthermore, according to the first aspect, the second DC power source and the first AC rotating electrical machine are configured to be connected via a single connecting route. Thus, a closed circuit including the first to third inverters and the phase coils of the first and second AC rotating electrical machines is not formed, and current circulation can be prevented from occurring. As a result, reduction in controllability of the first and second AC rotating electrical machines can be prevented.

The first aspect further includes a processor. Thus, the devices constituting the drive system can be appropriately controlled depending on the state of the devices, such as the first inverter, constituting the drive system.

According to a second aspect, a threshold for determining an overdischarged state of the first DC power source is set to be a first overdischarge threshold; a threshold for determining an overcharged state of the second DC power source is set to be a second overcharge threshold; the controller acquires a first charging rate that is a charging rate of the first DC power source as a state of the first DC power source and a second charging rate that is a charging rate of the second DC power source as a state of the second DC power source; and when the processor determines that the first charging rate is smaller than or equal to the first overdischarge threshold and the second charging rate is larger than or equal to the second overcharge threshold, the processor performs, as a process of changing the control state, a process of increasing electrical power fed from the second DC power source to the second AC rotating electrical machine via the third inverter and increasing generated power fed from the second AC rotating electrical machine to the first DC power source via the second inverter such that the first DC power source is charged by electrical power discharged from the second DC power source.

According to the second aspect, the first DC power source determined to be in an overdischarged state can be charged with the electrical power discharged by the second DC power source determined to be in an overcharged state and the electrical power generated by the second AC rotating electrical machine. Thus, surplus power of the second DC power source can be efficiently used, and an overdischarged state of the first DC power source and an overcharged state of the second DC power source can both be prevented.

According to a third aspect, a threshold for determining an overdischarged state of the first DC power source is set to be a first overdischarge threshold; a threshold for determining an overcharged state of the second DC power source is set to be a second overcharge threshold; the processor acquires a first charging rate that is a charging rate of the first DC power source as a state of the first DC power source and a second charging rate that is a charging rate of the second DC power source as a state of the second DC power source; and when the processor determines that the first charging rate is smaller than or equal to the first overdischarge threshold and the second charging rate is smaller than the second overcharge threshold, the processor performs, as a process of changing the control state, a process of increasing generated electrical power fed from the first AC rotating electrical machine to the first inverter such that the first DC power source is charged with power generated at the first AC rotating electrical machine.

According to the third aspect, the first DC power source determined to be in an overdischarged state can be charged with the electrical power generated by the first AC rotating electrical machine. Thus, the first DC power source can be prevented from entering an overdischarged state.

According to a fourth aspect, a threshold for determining an overcharged state of the first DC power source is set to be a first overcharge threshold; a threshold for determining an overdischarged state of the second DC power source is set to be a second overdischarge threshold; and when the processor determines that the first charging rate is larger than or equal to the first overcharge threshold and the second charging rate is smaller than or equal to the second overdischarge threshold, the processor performs, as a process of changing the control state, a process of increasing the electrical power fed from the second inverter to the second AC rotating electrical machine and increasing generated power fed from the second AC rotating electrical machine to the third inverter such that the second DC power source is charged with electrical power discharged from the first DC power source.

According to the fourth aspect, the second DC power source determined to be in an overdischarged state can be charged with the electrical power discharged by the first DC power source determined to be in an overcharged state and the power generated by the second AC rotating electrical machine. Thus, surplus power of the first DC power source can be efficiently used, and an overdischarged state of the second DC power source and an overcharged state of the first DC power source can both be prevented.

According to a fifth aspect, a threshold for determining an overcharged state of the first DC power source is set to be a first overcharge threshold; a threshold for determining an overdischarged state of the second DC power source is set to be a second overdischarge threshold; the processor acquires a first charging rate that is a charging rate of the first DC power source as a state of the first DC power source and a second charging rate that is a charging rate of the second DC power source as a state of the second DC power source; and when the processor determines that the first charging rate is larger than or equal to the first overcharge threshold and the second charging rate is larger than the second overdischarge threshold, the processor performs, as a process of changing the control state, at least one of a process of decreasing generated electrical power fed from the first AC rotating electrical machine to the first inverter such that the electrical power is discharged from the first DC power source and a process of increasing electrical power fed from the second inverter to the second AC rotating electrical machine such that electrical power is discharged from the first DC power source.

According to the fifth aspect, the control state of at least one of the first inverter and the second inverter is changed such that the first DC power source determined to be in an overcharged state discharges electrical power. Thus, the first DC power source can be prevented from entering an overcharged state.

According to a sixth aspect, a threshold for determining an overdischarged state of the first DC power source is set to be a first overdischarge threshold, and a threshold for determining an overcharged state of the first DC power source larger than the first overdischarge threshold is set to be a first overcharge threshold; a threshold for determining an overcharged state of the second DC power source is set to be a second overcharge threshold; and when the processor determines that the first charging rate is larger than the first overdischarge threshold and smaller than the first overcharge threshold and that the second charging rate is larger than or equal to the second overcharge threshold, the processor performs, as a process of changing the control state, a process of decreasing electrical power fed from the second inverter to the second AC rotating electrical machine and increasing electrical power fed from the third inverter to the second AC rotating electrical machine such that the second DC power discharges electrical power.

According to the sixth aspect, the control states of the second inverter and the third inverter are changed such that the second DC power source determined to be in an overcharged state discharges electrical power. Thus, the second DC power source can be prevented from entering an overcharged state.

According to a seventh aspect, a threshold for determining an overdischarged state of the first DC power source is set to be a first overdischarge threshold, and a threshold for determining an overcharged state of the first DC power source larger than the first overdischarge threshold is set to be a first overcharge threshold; a threshold for determining an overdischarged state of the second DC power source is set to be a second overdischarge threshold; and when the processor determines that the first charging rate is larger than the first overdischarge threshold and smaller than the first overcharge threshold and that the second charging rate is smaller than or equal to the second overdischarge threshold, the processor performs, as a process of changing the control state, a process of increasing generated electrical power fed from the second AC rotating electrical machine to the third inverter such that the second DC power is charged with electrical power generated by the second AC rotating electrical machine.

According to the seventh aspect, the control state of the third inverter is changed such that the second DC power source determined to be in an overdischarged state is charged. Thus, the second DC power source can be prevented from entering an overdischarged state.

According to an eighth aspect, the drive system is mounted on a vehicle; the second AC rotating electrical machine is connected to a wheel of the vehicle such that power is transmittable; and the processor performs a process of changing the control state such that torque of the second AC rotating electrical machine does not vary before and after performing the process of changing the control state.

According to an eighth aspect, the torque of the second AC rotating electrical machine, which is the driving power source of a vehicle, can be prevented from varying before and after performing the process of changing the control state. Thus, by performing the process of changing the control state, the user of the vehicle can be prevented from experiencing discomfort.

A ninth aspect includes a voltage setter that sets the voltage of the inverter-side connector of the boost converter to each voltage candidate value; and a loss calculator that calculates a loss presumed to occur in at least one of the boost converter, the first inverter, the second inverter, the third inverter, the first AC rotating electrical machine, and the second AC rotating electrical machine when the voltage of the inverter-side connector is the voltage candidate value set by the voltage setter, wherein the processor performs, as a process of changing the control state, a process of setting the voltage candidate value corresponding to the minimum loss among the losses calculated by the loss calculator for each voltage candidate value to be a converter voltage command value and controlling the boost converter such that the voltage of the inverter-side connector approaches the boost converter voltage command value.

The loss occurring in the devices, such as the boost converter, constituting the drive system varies depending on the voltage of the inverter-side connector. Thus, in the ninth aspect, the voltage setter sets the voltage of the inverter-side connector of the boost converter to each of the plurality of voltage candidate values. Then, the loss is calculated which is presumed to occur in at least one of the boost converter, the first inverter, the second inverter, the third inverter, the first AC rotating electrical machine, and the second AC rotating electrical machine when the voltage of the inverter-side connector is set to the voltage candidate value set by the voltage setter. Then, the voltage candidate value corresponding to the minimum loss among the losses calculated by the loss minimizer is set to be the converter voltage command value. Then, the boost converter is controlled such that the voltage of the inverter-side connector approaches the set converter voltage command value. Thus, the loss occurring in the drive system can be reduced.

Here, the ninth aspect can be specifically embodied such as in a tenth aspect.

According to a tenth aspect, when the voltage of the inverter-side connector is the voltage candidate value set by the voltage setter, the loss calculator calculates a total loss including losses occurring in the boost converter, the first inverter, the second inverter, the third inverter, the first AC rotating electrical machine, and the second AC rotating electrical machine.

According to the tenth aspect, the reduction effect on the loss occurring in the drive system can be enhanced.

According to an eleventh aspect, a ratio of the voltage of the power-source-side connector to a voltage of the inverter-side connector is defined to be a step-up ratio of the boost converter; a step-up limit voltage is smaller than a possible maximum value of an applied voltage of the inverter-side connector, the step-up limit voltage being the product of a possible maximum value of the step-up ratio of the boost converter and a possible maximum value of output voltage of the first DC power source; and when generated electrical power is fed from one of the first AC rotating electrical machine and the second AC rotating electrical machine to the other one, the processor performs, as a process of changing the control state, a process of stopping an operation of the boost converter when the applied voltage of the inverter-side connector exceeds the step-up limit voltage.

In the eleventh aspect, the step-up limit voltage is smaller than the possible maximum value of the applied voltage of the inverter-side connector. In this way, the size of the boost converter can be reduced, and the cost of the boost converter can also be reduced.

In the eleventh aspect, for example, when the generated power is fed from the first AC rotating electrical machine to the second AC rotating electrical machine, the operation of the boost converter is stopped in response to the voltage output from the first inverter to the inverter-side connector exceeding the step-up limit voltage. In this way, the voltage of the inverter-side connector is no longer controlled by the operation of the boost converter, and thus the generation voltage of one of the first and second AC rotating electrical machines can be increased without being limited by the control. As a result, loss occurring due to a current flowing through the first and second electrical paths can be reduced.

According to a twelfth aspect, the boost converter is configured to be able to perform a step-down operation to step down a DC voltage input from the inverter-side connector and feed the stepped-down DC voltage from the power-source-side connector to the first DC power source. The twelfth aspect includes a request determiner that determines whether there is a charge request for the first DC power source, wherein when the processor determines a charge request from the request determiner, the processor controls generated electrical power of at least one of the first inverter and the second inverter such that applied voltage of the inverter-side connector is smaller than or equal to the step-up limit voltage and instructs the boost converter to perform the step-down operation such that the first DC power source is charged with the generated electrical power.

In the twelfth aspect, when it is determined that there is a charge request of the first DC power source, the voltage applied to the inverter-side connector is set to be smaller than or equal to the step-up limit voltage. As a result, a step-down operation can be performed by the boost converter, and the first DC power source can be charged. In this way, the first DC power source can be prevented from entering an overdischarged state.

A thirteenth aspect includes a temperature acquirer that acquires a temperature of a target device including at least one of the first AC rotating electrical machine, the second AC rotating electrical machine, the first inverter, the second inverter, the third inverter, and the boost converter as a determination temperature, wherein a threshold for determining whether the target device is in an overheated state is set to be an overheat threshold, and when the determination temperature is determined to exceed the overheat threshold, the processor performs, as a process of changing the control state, a process of reducing the temperature of the target device by decreasing electrical power of the target device.

According to the thirteenth aspect, a target device constituting the drive system can be prevented from entering an overheated state, and reduction in reliability of the target device can be prevented.

A fourteenth aspect includes a temperature acquirer that acquires a temperature of a target device including at least one of the first AC rotating electrical machine, the second AC rotating electrical machine, the first inverter, the second inverter, the third inverter, and the boost converter as a determination temperature, wherein a threshold for determining the target device to be in a low-temperature state is set to be a low temperature threshold, and when the determination temperature is determined to fall below the low temperature threshold, the processor performs, as a process of changing the control state, a process of rising the temperature of the target device by increasing the electrical power of the target device.

According to the fourteenth aspect, a target device constituting the drive system can be prevented from entering a low-temperature state, and reduction in reliability of the target device can be prevented.

First Embodiment

A first embodiment in which a drive system according to the present disclosure is applied to a hybrid vehicle including a driving power source or engine and AC rotating electrical machines will now be described with reference to the drawings.

With reference to FIG. 1, the vehicle includes an engine 10, a first motor generator 20, a second motor generator 30, and a planetary gear train 40. In this embodiment, the first motor generator 20 and the second motor generator 30 are three-phase AC rotating electrical machines, more specifically, permanent magnet synchronous motors.

The second motor generator 30, together with the engine 10, is the driving power source of the vehicle and has a generating function under regenerative drive control. The first motor generator 20 has a function of a generator that employs the engine 10 as a power source and an electric motor that applies an initial rotation to an output shaft 10a of the engine 10 at the start of the engine 10.

The planetary gear train 40 is a member that enables mutual power transmission among the engine 10, the first motor generator 20, the second motor generator 30, and driven wheels 41. The planetary gear train 40 includes a ring gear, a sun gear, a planetary carrier, and multiple pinion gears that enable power transmission of between the sun gear and the ring gear. The rotary shaft of the planetary carrier is mechanically connected to the output shaft 10a of the engine 10, and the rotary shaft of the ring gear is mechanically connected to a drive shaft 42 and the rotary shaft of the rotor of the second motor generator 30. The driven wheels 41 is coupled to the drive shaft 42 via a differential gear 43. The rotary shaft of the sun gear is mechanically connected to the rotary shaft of the rotor of the first motor generator 20. The rotational rates of the sun gear, the carrier, and the ring gear are aligned on a nomographic diagram in the order of the rotational rate.

When the first motor generator 20 functions as a generator, the power input from the output shaft 10a of the engine 10 to the carrier is divided between and input to the sun gear and the ring gear, where the power input to the sun gear is the drive source of the first motor generator 20. On the other hand, when the first motor generator 20 functions as an electric motor, the power input from the first motor generator 20 to the sun gear is input to the output shaft 10a of the engine 10 via the carrier, to apply an initial rotation to the output shaft 10a.

The vehicle includes a boost converter 50, a first inverter 51, a second inverter 52, and a third inverter 53. In this embodiment, the first inverter 51, the second inverter 52, and the third inverter 53 are three-phase inverters.

The vehicle includes a first power source 60 and a second power source 61. In this embodiment, the first power source 60 and the second power source 61 are secondary batteries, specifically, lithium-ion rechargeable batteries. Note that the rated voltage of the second power source 61 (for example, 200 V) can be set to be, for example, lower than the rated voltage of the first power source 60 (for example, 300 V).

The boost converter 50 has a function of stepping up the output voltage of the first power source 60 and outputting the stepped-up voltage to the first inverter 51 and the second inverter 52. Furthermore, the boost converter 50 steps down the DC voltage outputted from at least one of the first inverter 51 and the second inverter 52 and feeds the stepped-down DC voltage to the first power source 60, to charge the first power source 60. Note that the first power source 60 may be electrically connected to an in-vehicle auxiliary device.

The electrical configuration of the in-vehicle drive system will now be described with reference to FIG. 2.

The boost converter 50 includes a reactor 50a, a first capacitor 50b, a second capacitor 50c, and a series-connected body of upper and lower arm step-up switches Scp and Scn. In this embodiment, the step-up switches Scp and Scn are voltage control type semiconductor switching elements, specifically, IGBTs. Thus, the high-potential-side terminals of the step-up switches Scp and Scn are the collectors, and the low-potential-side terminals are the emitters. The step-up switches Scp and Scn are connected in anti-parallel with free wheel diodes Dcp and Dcn, respectively.

A first end of the reactor 50a is connected to a first power-source-side terminal Cb1 of the boost converter 50, and a second end of the reactor 50a is connected to the emitter of the upper arm step-up switch Scp and the collector of the lower arm step-up switch Scn. The emitter of the lower arm step-up switch Scn is connected to a second power-source-side terminal Cb2 of the boost converter 50. The first power-source-side terminal Cb1 and the second power-source-side terminal Cb2 are connected via the first capacitor 50b. The first power-source-side terminal Cb1 is connected to the positive terminal of the first power source 60, and the second power-source-side terminal Cb2 is connected to the negative terminal of the first power source 60. Note that in this embodiment, the first power-source-side terminal Cb1 and the second power-source-side terminal Cb2 are equivalent to "power-source-side connectors."

The collector of the upper arm step-up switch Scp is connected to a first inverter-side terminal Ci1 of the boost converter 50, and the emitter of the lower arm step-up switch Scn is connected to a second inverter-side terminal Ci2 of the boost converter 50. The first inverter-side terminal Ci1 and the second inverter-side terminal Ci2 are connected via the second capacitor 50c. Note that in this embodiment, the first inverter-side terminal Ci1 and the second inverter-side terminal Ci2 are equivalent to "inverter-side connectors."

The first inverter 51 includes a series-connected body of upper arm first switches S1p and lower arm first switches S1n corresponding to the U, V, and W phases. In this embodiment, the first switches S1p and S1n are voltage control type semiconductor switching elements, specifically, IGBTs. The first switches S1p and S1n are connected in anti-parallel with free wheel diodes D1p and D1n, respectively.

In the U phase, the connecting point of the upper and lower arm first switches S1p and S1n is connected to a first end of a U-phase coil 20U of the first motor generator 20. In the V phase, the connecting point of the upper and lower arm first switches S1p and S1n is connected to a first end of a V-phase coil 20V of the first motor generator 20. In the W phase, the connecting point of the upper and lower arm first switches S1p and S1n is connected to a first end of a W-phase coil 20W of the first motor generator 20. Second ends of the U-, V-, and W-phase coils 20U, 20V, and 20W are connected to a neutral point. In this embodiment, the U-, V-, and W-phase coils 20U, 20V, and 20W are disposed such that the phases are different by 120 degrees in electrical angle.

A terminal of the first inverter 51 or a first high-potential-side terminal CH1 is connected to the collectors of the upper arm first switches S1p. The first high-potential-side terminal CH1 is connected to the first inverter-side terminal Ci1 of the boost converter 50 via a first high-potential electrical path LH1. A terminal of the first inverter 51 or a first low-potential-side terminal CL1 is connected to the emitters of the lower arm first switches S1n. The first low-potential-side terminal CL1 is connected to the second inverter-side terminal Ci2 of the boost converter 50 via a first low-potential electrical path LL1.

The second inverter 52 includes a series-connected body of upper arm second switches S2p and lower arm second switches S2n corresponding to the U, V, and W phases. In this embodiment, the second switches S2p and S2n are voltage control type semiconductor switching elements, specifically, IGBTs. The second switches S2p and S2n are connected in anti-parallel with free wheel diodes D2p and D2n, respectively.

A terminal of the second inverter 52 or a second high-potential-side terminal CH2 is connected to the collectors of the upper arm second switches S2p. The second high-potential-side terminal CH2 is connected to the first inverter-side terminal Ci1 via a second high-potential electrical path LH2. A terminal of the second inverter 52 or a second low-potential-side terminal CL2 is connected to the emitters of the lower arm second switches S2n. The second low-potential-side terminal CL2 is connected to the second low-potential-side terminal Ci2 via a second low-potential electrical path LL2.

In the U phase, the connecting point of the upper and lower arm second switches S2p and S2n is connected to a first end of a U-phase coil 30U of the second motor generator 30. In the V phase, the connecting point of the upper and lower arm second switches S2p and S2n is connected to a first end of a V-phase coil 30V of the second motor generator 30. In the W phase, the connecting point of the upper and lower arm second switches S2p and S2n is connected to a first end of a W-phase coil 30W of the second motor generator 30. In this embodiment, the U-, V-, and W-phase coils 30U, 30V, and 30W are disposed such that the phases are different by 120 degrees in electrical angles.

The third inverter 53 includes a series-connected body of upper arm third switches S3p and lower arm third switches S3n corresponding to the U, V, and W phases. In this embodiment, the third switches S3p and S3n are voltage control type semiconductor switching elements, specifically, IGBTs. The third switches S3p and S3n are connected in anti-parallel with free wheel diodes D3p and D3n, respectively.

In the U phase, the connecting point of the upper and lower arm third switches S3p and S3n is connected to a second of the U-phase coil 30U. In the V phase, the connecting point of the upper and lower arm second switches S3p and S3n is connected to a second of the V-phase coil 30V. In the W phase, the connecting point of the lower arm third switches S3p and S3n is connected to a second of the W-phase coil 30W.

A terminal of the third inverter 53 or a third high-potential-side terminal CH3 is connected to the collectors of the upper arm third switches S3p. The third high-potential-side terminal CH3 is connected to the positive terminal of the second power source 61. A terminal of the third inverter 53 or a third low-potential-side terminal CL3 is connected to the emitters of the lower arm third switches S3n. The third low-potential-side terminal CL3 is connected to the negative terminal of the second power source 61. The third high-potential-side terminal CH3 and the third low-potential-side terminal CL3 are connected via the third capacitor 55.

Figure 3:
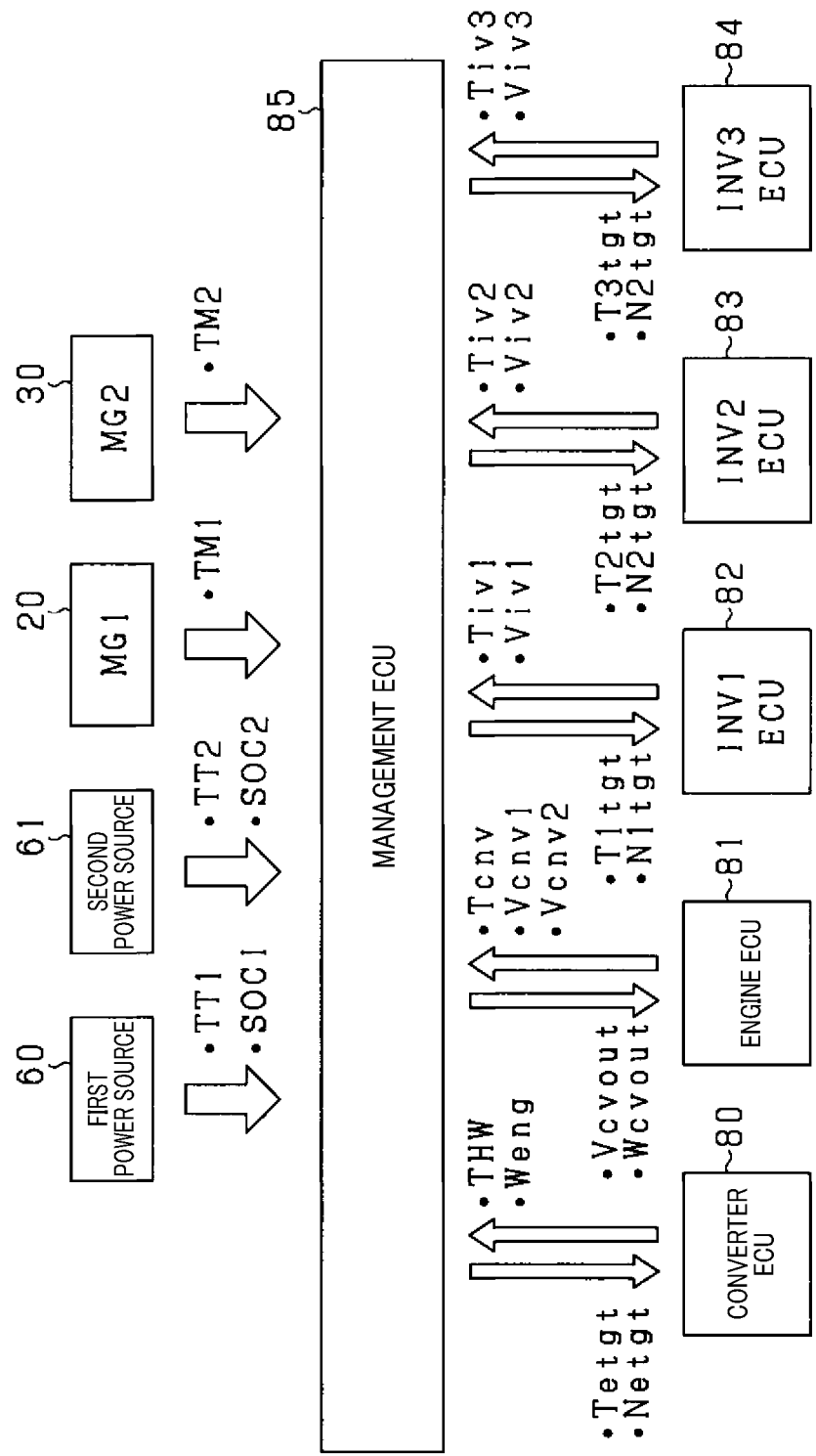
FIG. 3 is a diagram illustrating ECUs.

The controlling devices disposed in the vehicle will now be described with reference to FIG. 3.

The vehicle includes an engine ECU 80 controlling the engine 10, a converter ECU 81 controlling the boost converter 50, a first inverter ECU 82 controlling the first inverter 51, a second inverter ECU 83 controlling the second inverter 52, and a third inverter ECU 84 controlling the third inverter 53.

The vehicle includes a management ECU 85 that is a higher-order control device of the ECUs 80 to 84. In this embodiment, the management ECU 85 includes a "processor." The management ECU 85 acquires information including the cooling water temperature THW of the engine 10 and the current output Weng of the engine 10, from the engine ECU 80. The management ECU 85 outputs information including an engine torque command value Tetgt and an engine rotational rate command value Netgt based on the acquired information to the engine ECU 80. The engine ECU 80 performs combustion control based on the information acquired from the management ECU 85 to control the actual torque of the engine 10 to be the engine torque command value Tetgt and the actual rotational rate of the engine 10 to be the engine rotational rate command value Netgt.

The management ECU 85 acquires information including the temperature Tcnv of the boost converter 50, the terminal voltage of the first capacitor 50b or a first converter voltage Vcnv1, and the terminal voltage of the second capacitor 50c or a second converter voltage Vcnv2, from the converter ECU 81. Here, the temperature of the boost converter 50 is, for example, the temperature of the step-up switches Scp and Scn. The management ECU 85 outputs information including a converter voltage command value Vcvout and a converter power command value Wcvout based on the acquired information, to the converter ECU 81. When the boost converter 50 is instructed to perform a step-up operation, the converter ECU 81 controls the on/off of the lower arm step-up switch Scn to control the second converter voltage Vcnv2 to be the converter voltage command value Vcvout and feedback-control the output power from the first and second inverter-side terminals Ci1 and Ci2 to be the converter power command value Wcvout. Note that in this embodiment, the upper arm step-up switch Scp remains turned off during the step-up operation.

In contrast, when the boost converter 50 is instructed to perform a step-down operation, the converter ECU 81 controls the on/off of the upper arm step-up switch Scp to control the first converter voltage Vcnv1 to be the converter voltage command value Vcvout and the first and feedback controls the output power from the second power-source-side terminals Cb1 and Cb2 to be the converter power command value Wcvout. Note that in this embodiment, the lower arm step-up switch Scn remains turned off during the step-down operation.

The management ECU 85 acquires information including the temperature detection value TT1 of a first temperature detector detecting the temperature of the first power source 60, a charging rate (SOC) of the first power source 60 or a first charging rate SOC1, a temperature detection value TT2 of a second temperature detector detecting the temperature of the second power source 61, and a charging rate of the second power source 61 or a second charging rate SOC2.

The management ECU 85 acquires the temperature TM1 of the first motor generator 20 and the temperature TM2 of the second motor generator 30. The management ECU 85 acquires the temperature Tiv1 of the first inverter 51 and the potential difference across the first high- and low-potential-side terminals CH1 and CL1 or a first power source voltage Viv1 from the first inverter ECU 82 and the temperature Tiv2 of the second inverter 52 and the potential difference across the second high- and low-potential-side terminals CH2 and CL2 or a second power source voltage Viv2 from the second inverter ECU 83. The management ECU 85 acquires the temperature Tiv3 of the third inverter 53 and the potential difference across the third high- and low-potential-side terminals CH3 and CL3 or a third power source voltage Viv3 from the third inverter ECU 84.

The management ECU 85 outputs information including a first torque command value T1tgt and a first rotational rate command value N1tgt based on the variety of acquired information, to the first inverter ECU 82. The first inverter ECU 82 controls the switches S1p and S1n constituting the first inverter 51 on the basis of the information acquired from the management ECU 85 to control the actual torque of the first motor generator 20 to be the first torque command value T1tgt and the actual rotational rate of the first motor generator 20 to be the first rotational rate command value N1tgt. In this way, in this embodiment, sinusoidal phase currents having phases different by 120 degrees in electrical angles flow through the phase coils 20U, 20V, and 20W of the first motor generator 20.

The management ECU 85 outputs information including a second torque command value T2tgt and a second rotational rate command value N2tgt based on the variety of acquired information, to the second inverter ECU 83. The management ECU 85 outputs information including a third torque command value T3tgt and a second rotational rate command value N2tgt based on the variety of acquired information, to the third inverter ECU 84. The second and third inverter ECUs 83 and 84 control the switches S2p, S2n, S3p, and S3n constituting the second and third inverters 52 and 53 on the basis of the information acquired from the management ECU 85, to control the actual torque of the second motor generator 30 to be the torque sum of the second torque command value T2tgt and the third torque command value T3tgt and the actual rotational rate of the second motor generator 30 to be the second rotational rate command value N2tgt. In this way, in this embodiment, sinusoidal phase currents having phases different by 120 degrees in electrical angle flow through the phase coils 30U, 30V, and 30W of the second motor generator 30.

Figures 4, 5:
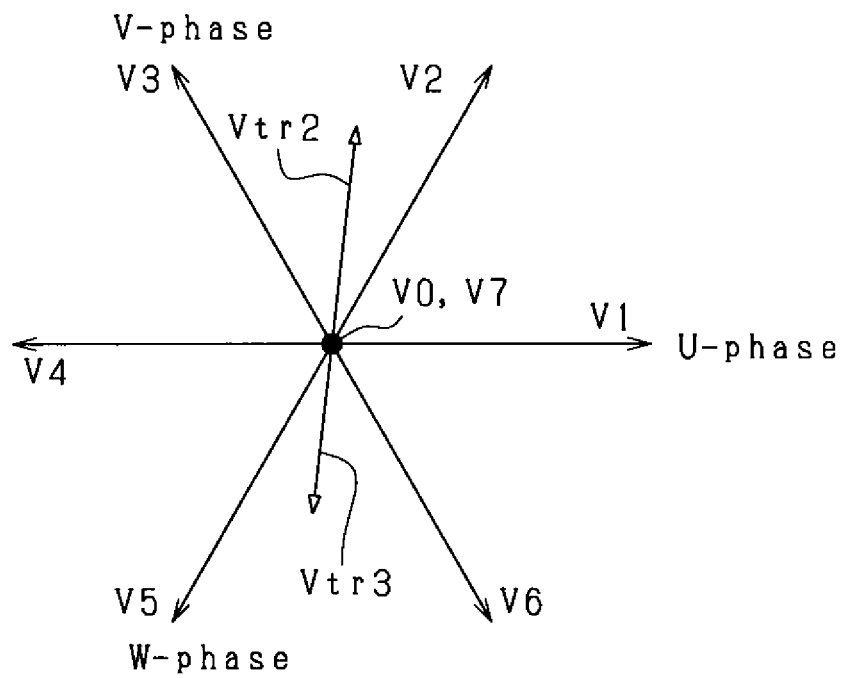
FIG. 4 is a diagram illustrating a method of controlling second and third inverters.
FIG. 5 is a diagram illustrating a relation between voltage vectors and the driving state of switches.

In this embodiment, the second inverter ECU 83 and the third inverter ECU 84 control the switches S2p, S2n, S3p, and S3n constituting the second and third inverters 52 and 53 such that the phase of the output voltage vector of the second inverter 52 or a second output voltage vector Vtr2 and the phase of the output voltage vector of the third inverter 53 or a third output voltage vector Vtr3 differ by 180 degrees in electrical angles, as illustrated in FIG. 4. This increases the voltage applied to the phase coils of the second motor generator 30 and the output torque of the second motor generator 30. Note that FIG. 5 illustrates the drive modes of the lower arm switches corresponding to the active voltage vectors V1 to V6 and the reactive voltage vectors V0 and V7.

The advantageous effects of this embodiment will now be described.

Figure 6:
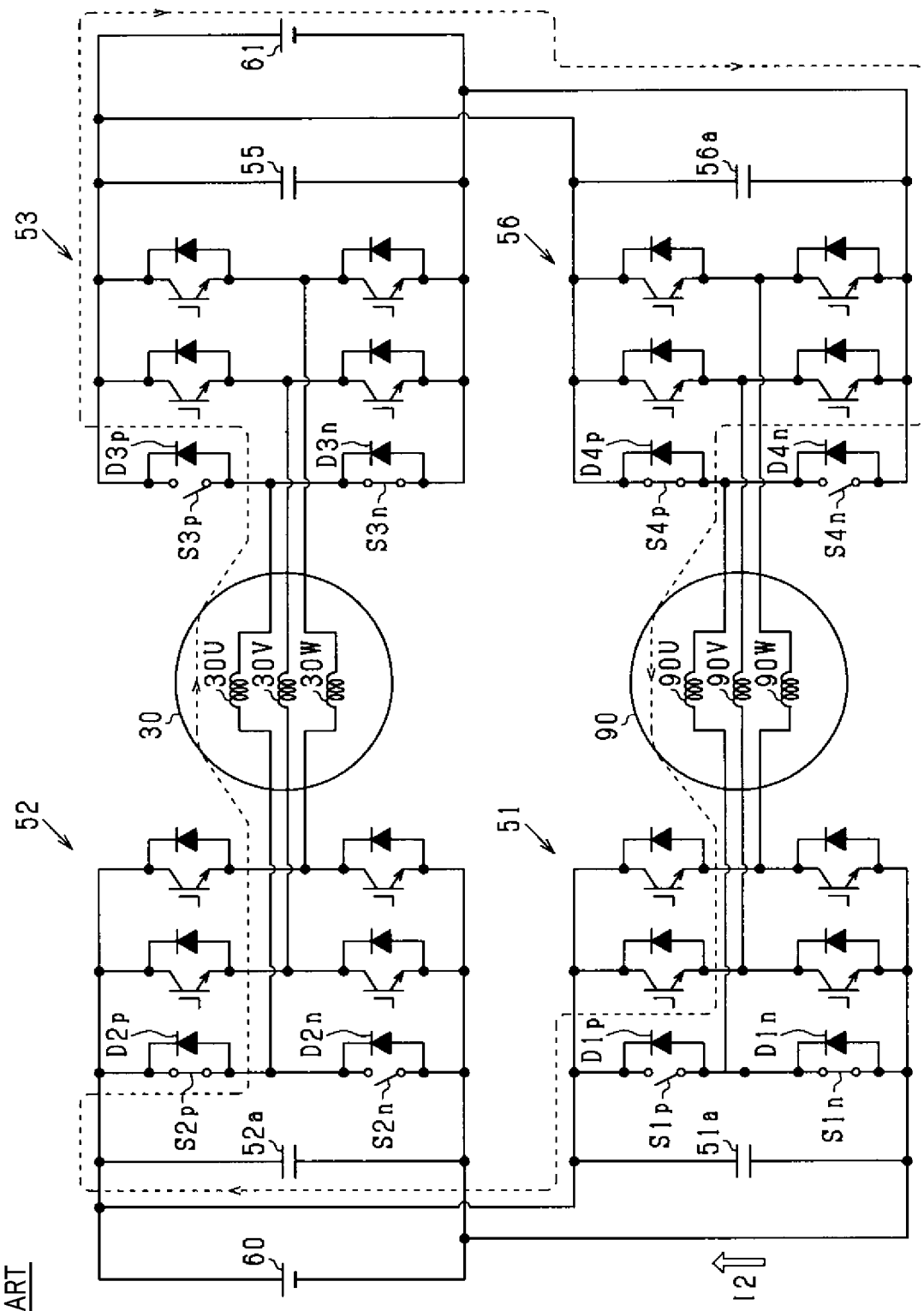
FIG. 6 is a diagram illustrating generation of current circulation according to the related art.

According to this embodiment, the advantageous effect can be achieved in which controllability of torque and rotational rate of the first motor generator 20 and the second motor generator 30 can be prevented from decreasing without causing current circulation. The advantageous effects of this embodiment will now be described in comparison with those of the related art. FIG. 6 illustrates the related art. Note that in FIG. 6, the components that are the same as those in FIG. 2 will be denoted by the same reference signs for convenience.

With reference to FIG. 6, the vehicle includes a first motor generator 90 and a fourth inverter 56. The configuration of the first motor generator 90 is the same as that of the second motor generator 30, and the configuration of the fourth inverter 56 is the same as that of the third inverter 53.

In the U phase, the connecting point of the upper and lower arm first switches S1p and S1n is connected to a first end of a U-phase coil 90U of the first motor generator 90. In the V phase, the connecting point of the upper and lower arm first switches S1p and S1n is connected to a first end of a V-phase coil 90V of the first motor generator 90. In the W phase, the connecting point of the lower arm first switches S1p and S1n is connected to a first end of a W-phase coil 90W of the first motor generator 90.

A second end of a U-phase coil 90U is connected to a connecting point of upper and lower arm fourth switches S4p and S4n in the U phase constituting the fourth inverter 56. A second end of a V-phase coil 90V is connected to a connecting point of upper and lower arm fourth switches S4p and S4n in the V phase constituting the fourth inverter 56. A second end of a W-phase coil 90W is connected to a connecting point of upper and lower arm fourth switches S4p and S4n in the W phase constituting the fourth inverter 56. Note that the fourth switches S4p and S4n are connected in anti-parallel with free wheel diodes D4p and D4n.

The collector of the upper arm fourth switch S4p and the emitter of the lower arm fourth switch S4n are connected via a fourth capacitor 56a. The collector of the upper arm fourth switch S4p is connected to the positive terminal of the second power source 61, and the emitter of the lower arm fourth switch S4n is connected to the negative terminal of the second power source 61.

In the related art, the switches S1p, S1n, S4p, and S4n constituting the first and fourth inverters 51 and 56 are controlled such that the phase of the output voltage vector of the first inverter 51 or a first output voltage vector and the phase of the output voltage vector of the fourth inverter 56 or a fourth output voltage vector differ by 180 degrees in electrical angles.

Here, in the related art, current circulation may occur. Current circulation is the flowing of a current through a closed circuit including the coils of the first motor generator 90, the first inverter 51, the coils of the second motor generator 30, the third inverter 53, and the fourth inverter 56. Current circulation will now be described through the U phase as an example with reference to FIG. 6.

FIG. 6 illustrates an example in which the regenerative power generated by the first motor generator 90 and the second motor generator 30 are fed to the first power source 60 to charge the first power source 60. FIG. 6 also illustrates a case in which the regenerative voltage of the first motor generator 90 (for example, 50 V) is lower than the regenerative generation voltage of the second motor generator 30 (for example, 100 V).

In the example illustrated in FIG. 6, the phase of the second output voltage vector Vtr2 the phase of the third output voltage vector Vtr3 differ by 180 degrees. Thus, as indicated by the dashed lines in FIG. 6, in the U phase, current circulation occurs in which a current flows through a closed circuit including the upper arm second switch S2p, the U-phase coil 30U, the free wheel diode D3p of the third inverter 53, the second power source 61, the free wheel diode D4n of the fourth inverter 56, the U-phase coil 90U, and the free wheel diode D1p of the first inverter 51. In such a case, the controllability of the torque and rotational rate of the first motor generator 90 and the second motor generator 30 decreases.

Figure 2:
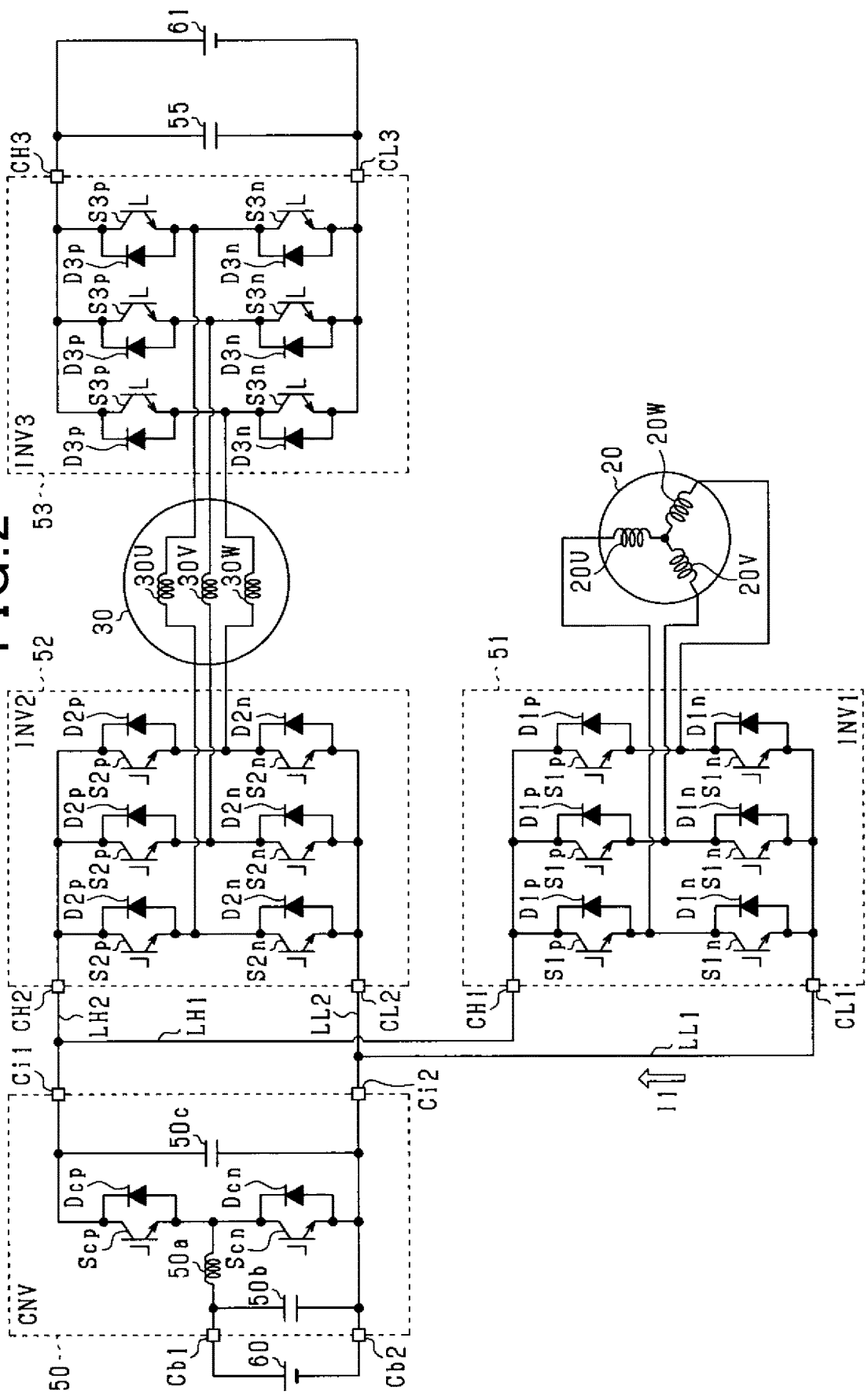
FIG. 2 is a diagram illustrating motor generators, inverters, etc.

In contrast, this embodiment, as illustrated in FIG. 2, is configured such that the second power source 61 and the first motor generator 20 are connected through a single connecting route to prevent the second power source 61 and the first motor generator 20 from being electrically connected without the third inverter 53, the coils of the second motor generator 30, the second inverter 52, and the first inverter 51. In other words, the first motor generator 20, the first inverter 51, the second inverter 52, the coils of the second motor generator 30, and the third inverter 53 are connected in this order in an I-shape, not an O-shape. Thus, in this embodiment, the second power source 61 and the first motor generator 20 are not directly connected, and the third inverter 53 and the first motor generator 20 are connected only through a route passing through the second motor generator 30. Thus, no current circulation occurs when the first DC power source 60 is charged by the first motor generator 20. Also, in this embodiment, no current circulation occurs when the second DC power source 61 is charged by the second motor generator 30. That is, the two AC generators are connected through a single connecting route, and thus, no current circulation occurs when a DC power source is charged by one of the AC generators. Thus, the controllability of torque and rotational rate of the first and second motor generator 20 and 30 can be prevented from decreasing.

This embodiment can achieve an advantageous effect of reducing copper loss caused by currents flowing through the electrical paths LH1, LL1, LH2, and LL2. This advantageous effect will now be described in comparison with that of the related art.

In the related art, the regenerative power generated by the first motor generator 90 is denoted as PW. Furthermore, in the related art, the output voltage of the first power source 60 is set to 300 V, and, in this embodiment, the terminal voltage of the second capacitor 50c is stepped up to 600 V by the boost converter 50. Moreover, in the related art, the current flowing from the first inverter 51 to the first power source 60 is denoted as I2, and, in this embodiment, the current flowing from the first inverter 51 to the boost converter 50 is denoted as I1. In such a case, if the regenerative power generated by the first motor generator 90 according to the related art and the regenerative power generated by the first motor generator 20 according to this embodiment are both the same and denoted by PW, "PW=300 [V]×I2=600 [V]×I1" holds. In such a case, the current I1 according to this embodiment is half the current I2 according to the related art. Thus, according to this embodiment, copper loss caused by currents flowing through the electrical paths LH1, LL1, LH2, and LL2 can be reduced. The reduction of copper loss can then prevent reduction in efficiency of the drive system due to heat loss, and thereby can eliminate the use of wires having a large diameter as the electrical paths LH1, LL1, LH2, and LL2.

A charged state control process for preventing overdischarge and overcharge of the first power source 60 and the second power source 61 will now be described with reference to FIG. 7. This process is, for example, repeatedly performed in a predetermined cycle by the management ECU 85.

Figure 8:
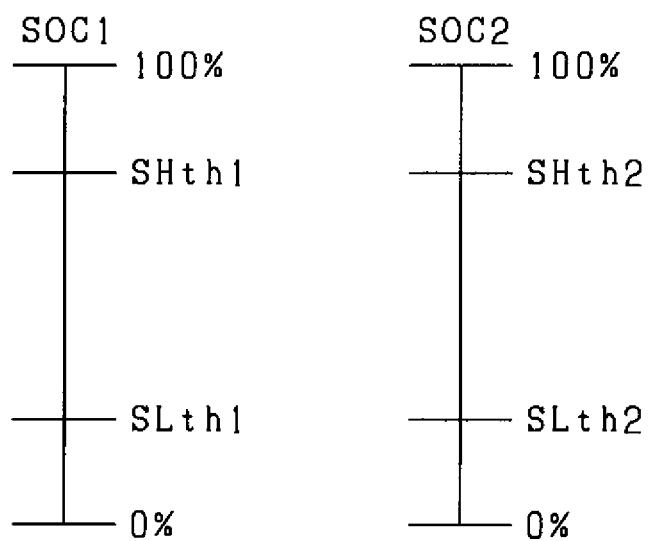
FIG. 8 is a diagram illustrating a size relation between an overdischarge threshold and an overcharge threshold.

In this series of processing, first, in step S10, it is determined whether the first charging rate SOC1 is smaller than or equal to a first overdischarge threshold SLth1. In this embodiment, the first overdischarge threshold SLth1 is set to be the lower limit of the first charging rate SOC1 that can prevent reduction in reliability of the first power source 60. In this embodiment, the first overdischarge threshold SLth1 is set to be a value larger than the lower limit (0%) of the possible charging rate of the first power source 60 and smaller than the upper limit (100%) of the possible charging rate of the first power source 60, as illustrated in FIG. 8. Note that the first overdischarge threshold SLth1 may be variably set on the basis of, for example, the temperature detection value TT1 of the first power source 60.

If an affirmative determination is made in step S10, it is determined that the first power source 60 is likely to enter an overdischarged state, and the process proceeds to step S12. In step S12, it is determined whether the second charging rate SOC2 is larger than or equal to a second overcharge threshold SHth2. In this embodiment, the second overcharge threshold SHth2 is set to be the upper limit of the second charging rate SOC2 that can prevent reduction in reliability of the second power source 61. In this embodiment, the second overcharge threshold SHth2 is set to be a value larger than the lower limit (0%) of the possible charging rate of the second power source 61 and smaller than the upper limit (100%) of the possible charging rate of the second power source 61, as illustrated in FIG. 8. Note that the second overcharge threshold SHth2 may be variably set on the basis of, for example, the temperature detection value TT2 of the second power source 61.

If an affirmative determination is made in step S12, it is determined that the second power source 61 is likely to enter an overcharged state, and the process proceeds to step S14. In step S14, a process of increasing the acceleration power fed from the third inverter 53 to the second motor generator 30 and a process of increasing the regenerative power fed from the second motor generator 30 to the second inverter 52 are performed to feed electrical power from the second power source 61 to the first power source 60. A process of instructing the boost converter 50 to perform a step-down operation is also performed. The acceleration power fed from the third inverter 53 to the second motor generator 30 is electrical power consumed by the second motor generator 30. The regenerative power fed from the second motor generator 30 to the second inverter 52 is electrical power consumed by the second motor generator 30.

As a process of increasing the acceleration power in this embodiment, a process of varying the second torque command value T2tgt in a direction that increases the electrical power consumed by the second motor generator 30 is performed. The second inverter ECU 83 controls the second inverter 52 on the basis of the varied second torque command value T2tgt.

As a process of increasing the regenerative power in this embodiment, a process of varying the third torque command value T3tgt in a direction that increases the electrical power generated by the second motor generator 30 is performed. The third inverter ECU 84 controls the third inverter 53 on the basis of the varied third torque command value T3tgt.

In this embodiment, the second torque command value T2tgt and the third torque command value T3tgt are varied to prevent a variation in the amplitude of the composite vector of the second output voltage vector Vtr2 and the third output voltage vector Vtr3 before and after increasing the acceleration power fed from the third inverter 53 to the second motor generator 30 and the regenerative power fed from the second motor generator 30 to the second inverter 52. This prevents torque shock caused by a variation in torque command values and prevents reduction in drivability. The method of varying a torque command value will now be described with reference to FIG. 9.

Figure 9:
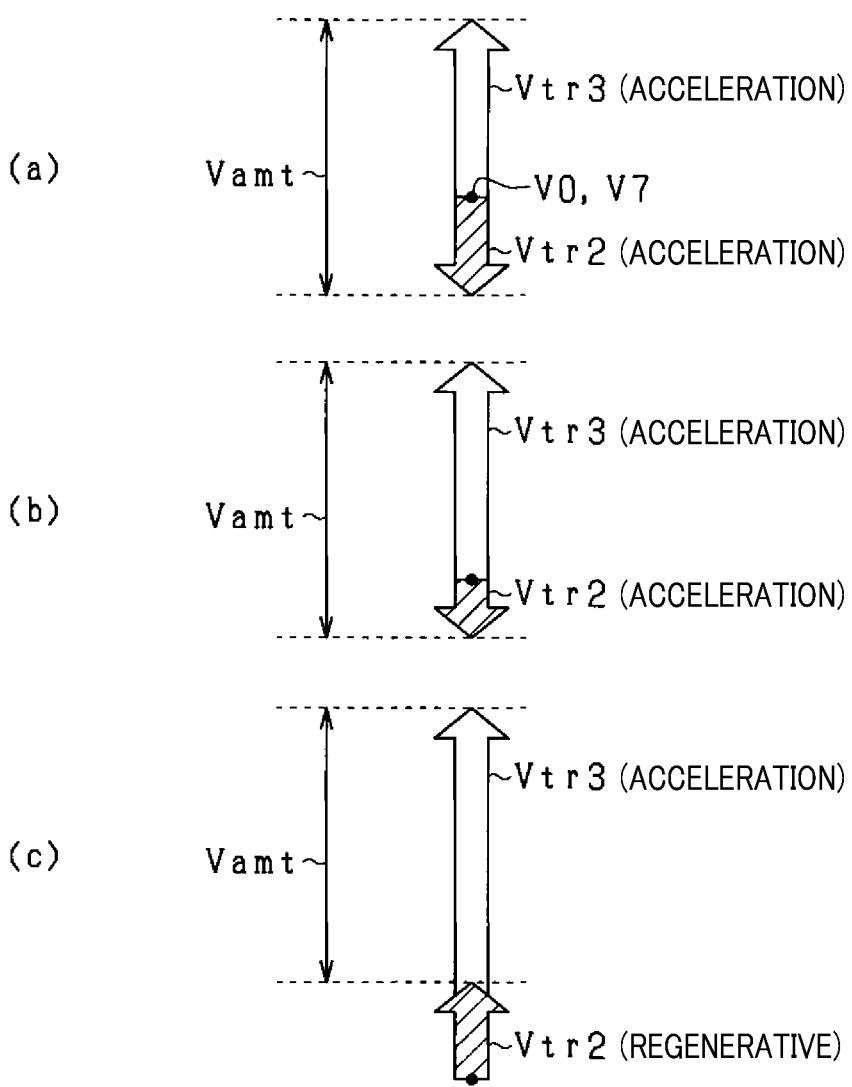
FIG. 9 is a diagram illustrating that the amplitude of a composite voltage vector does not change before and after a change in the control state.

FIG. 9(a) illustrates the second output voltage vector Vtr2 and the third output voltage vector Vtr3 before varying the second torque command value T2tgt and the third torque command value T3tgt. Note that in FIG. 9, the second output voltage vector Vtr2 and the third output voltage vector Vtr3 are illustrated with reference to a point indicating reactive voltages V0 and V7 in a voltage vector space.

The second torque command value T2tgt is varied in a direction that increases the electrical power consumed by the second motor generator 30, and the third torque command value T3tgt is varied in a direction that increases the electrical power generated by the second motor generator 30. As a result, the amplitude of the composite vector of the second and third output voltage vectors Vtr2 and Vtr3 is maintained at Vamt, the amplitude of the second output voltage vector Vtr2 decreases, and the amplitude of the third output voltage vector Vtr3 increases, as illustrated in FIG. 9(b).

The second torque command value T2tgt is further varied in a direction that increases the electrical power consumed by the second motor generator 30, and the third torque command value T3tgt is further varied in a direction that increases the electrical power generated by the second motor generator 30. As a result, the amplitude of the composite vector of the second and third output voltage vectors Vtr2 and Vtr3 is maintained at Vamt, the amplitude of the third output voltage vector Vtr3 further increases and the sign of the amplitude of the second output voltage vector Vtr2 is reversed from a sign indicating acceleration drive to a sign indicating regenerative drive, as illustrated in FIG. 9(c).

The process of Step S14 increases the power discharged from the second power source 61 and can prevent the second power source 61 from entering an overcharged state. Furthermore, the process of step S14 increases the electrical power charged in the first power source 60 and can prevent the first power source 60 from entering an overdischarged state.

Figure 7:
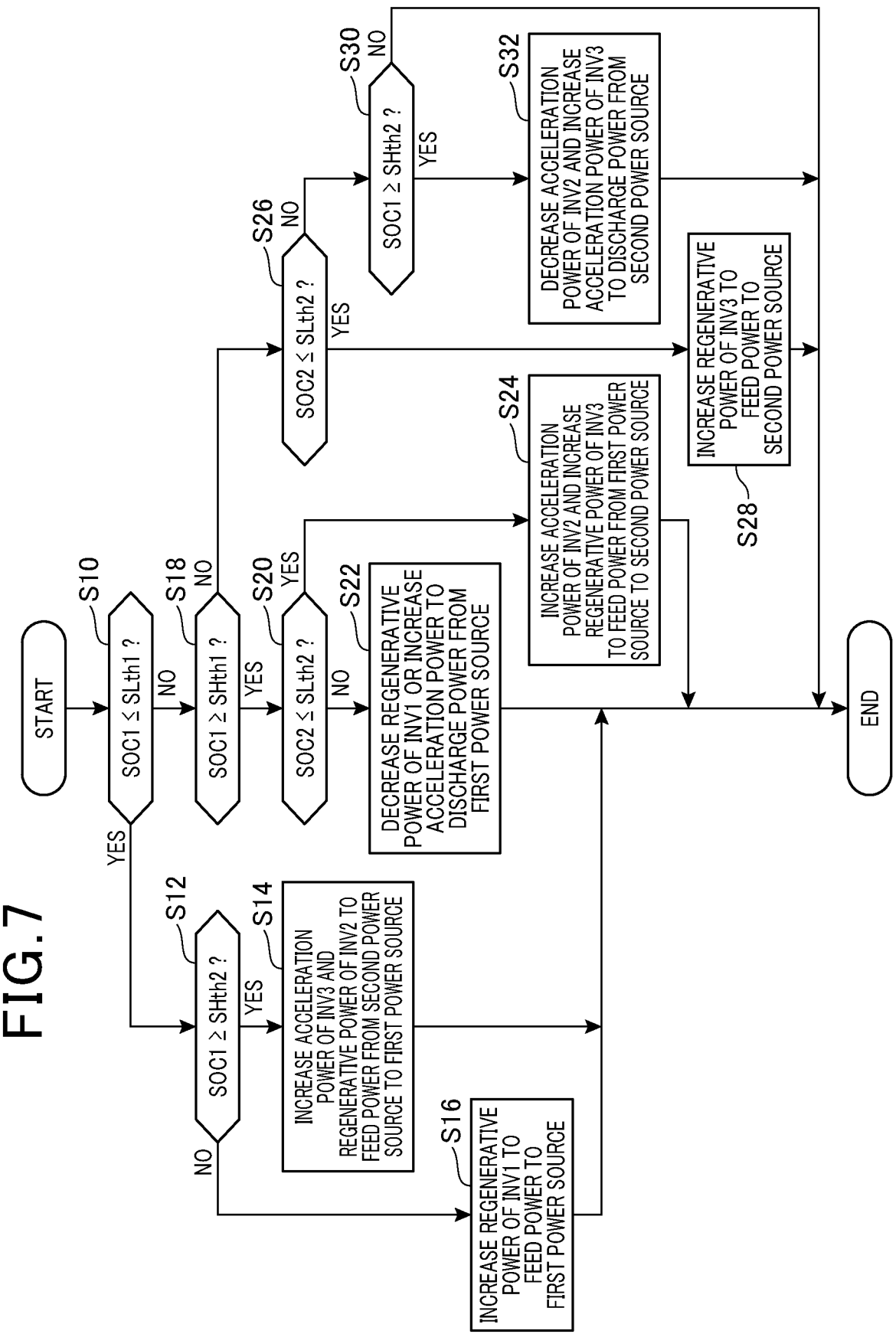
FIG. 7 is a flow chart illustrating the procedures in a charged state control process.

Referring back to the description on FIG. 7, if a negative determination is made in step S12, it is determined that the second power source 61 is not likely to enter an overcharged state, and the process proceeds to step S16. In step S16, a process of increasing the regenerative power fed from the first motor generator 20 to the first inverter 51 is performed to feed electrical power to the first power source 60. A process of instructing the boost converter 50 to perform a step-down operation is also performed. As a process of increasing the regenerative power to be fed to the first inverter 51 in this embodiment, a process of varying the first torque command value T1tgt in a direction that increases the regenerative power generated by the first motor generator 20 is performed. The first inverter ECU 82 controls the first inverter 51 on the basis of the varied first torque command value T1tgt. The process of step S16 increases the power charged in the first power source 60 and can prevent the first power source 60 from entering an overdischarged state.

If a negative determination is made in step S10, it is determined that the first power source 60 is not likely to enter an overdischarged state, and the process proceeds to step S18. In step S18, it is determined whether the first charging rate SOC1 is larger than or equal to a first overcharge threshold SHth1. In this embodiment, the first overcharge threshold SHth1 set to be the upper limit of the first charging rate SOC1 that can prevent reduction in reliability of the first power source 60. In this embodiment, the first overcharge threshold SHth1 is set to be a value larger than the first overdischarge threshold SLth1 and smaller than the upper limit of the possible charging rate of the first power source 60, as illustrated in FIG. 8. Note that the first overcharge threshold SHth1 may be variably set on the basis of, for example, the temperature detection value TT1 of the first power source 60.

If an affirmative determination is made in step S18, it is determined that the first power source 60 is likely to enter an overcharged state, and the process proceeds to step S20. In step S20, it is determined whether the second charging rate SOC2 is smaller than or equal to a second overdischarge threshold SLth2. In this embodiment, the second overdischarge threshold SLth2 is set to be the lower limit of the second charging rate SOC2 that can prevent reduction in reliability of the second power source 60. In this embodiment, the second overdischarge threshold SLth2 is set to be a value larger than the lower limit of the possible charging rate of the second power source 61 and smaller than the second overcharge threshold SHth2, as illustrated in FIG. 8. Note that the second overdischarge threshold SLth2 may be variably set on the basis of, for example, the temperature detection value TT2 of the second power source 61.

If a negative determination is made in step S20, it is determined that the second power source 61 is not likely to enter an overdischarged state, and the process proceeds to step S22. In step S22, a process of decreasing the regenerative power fed from the first motor generator 20 to the first inverter 51 or a process of increasing the acceleration power fed from the second inverter 52 to the second motor generator 30 is performed, to discharge electrical power from the first power source 60. A process of instructing the boost converter 50 to step up the voltage is also performed.

As a process of decreasing the regenerative power to be fed to the first inverter 51 in this embodiment, a process of varying the first torque command value T1tgt in a direction that decreases the electrical power generated by the first motor generator 20 is performed. In contrast, as a process of increasing acceleration power fed to the second motor generator 30, a process of varying the second torque command value T2tgt in a direction that increases the electrical power consumed by the second motor generator 30 is performed.

The process of Step S22 increases the power discharged from the first power source 60 and can prevent the first power source 60 from entering an overcharged state.

In step S22, the process of decreasing the regenerative power fed from the first motor generator 20 to the first inverter 51 and the process of increasing the acceleration power fed from the second inverter 52 to the second motor generator 30 may both be performed.

If an affirmative determination is made in step S20, it is determined that the second power source 61 is likely to enter an overdischarged state, and the process proceeds to step S24. In step S24, a process of increasing the acceleration power fed from the second inverter 52 to the second motor generator 30 and a process of increasing the regenerative power fed from the second motor generator 30 to the third inverter 53 are performed, to feed electrical power from the first power source 60 to the second power source 61. A process of instructing the boost converter 50 to step up the voltage is also performed.

In this embodiment, a process of varying the second torque command value T2tgt in a direction that increases the electrical power consumed by the second motor generator 30 is performed as a process of increasing acceleration power fed to the second motor generator 30. As a process of increasing the regenerative power to be fed to the third inverter 53 in this embodiment, a process of varying the third torque command value T3tgt in a direction that increases the electrical power generated by the second motor generator 30 is performed. The process of Step S24 increases the electrical power discharged from the first power source 60 and the electrical power charged in the second power source 61, and thus the first power source 60 can be prevented from entering an overcharged state and the second power source 61 can be prevented from entering an overdischarged state.

In this embodiment, the second torque command value T2tgt and the third torque command value T3tgt are varied to prevent a variation in the amplitude of the composite vector of the second output voltage vector Vtr2 and the third output voltage vector Vtr3 before and after increasing the acceleration power fed from the second inverter 52 to the second motor generator 30 and the regenerative power fed from the second motor generator 30 to the third inverter 53.

If a negative determination is made in step S18, it is determined that the first power source 60 is not likely to enter an overcharged state, and the process proceeds to step S26. In step S26, it is determined whether the second charging rate SOC2 is smaller than or equal to a second overdischarge threshold SLth2.

If an affirmative determination is made in step S26, it is determined that the second power source 61 is likely to enter an overdischarged state, and the process proceeds to step S28. In step S28, a process of increasing the regenerative power fed from the second motor generator 30 to the third inverter 53 is performed to feed electrical power to the second power source 61. As a process of increasing the regenerative power fed to the third inverter 53 in this embodiment, a process of varying the third torque command value T3tgt in a direction that increases the power generated by the second motor generator 30 is performed. The process of step S28 increases the power charged in the second power source 61 and can prevent the second power source 61 from entering an overdischarged state.

In contrast, if a negative determination is made in step S26, it is determined that the second power source 61 is not likely to enter an overdischarged state, and the process proceeds to step S30. In step S30, it is determined whether the second charging rate SOC2 larger than or equal to the second overcharge threshold SHth2.

If an affirmative determination is made in step S30, it is determined that the second power source 61 is likely to enter an overcharged state, and the process proceeds to step S32. In step S32, a process of decreasing the acceleration power fed from the second inverter 52 to the second motor generator 30 and a process of increasing acceleration power fed from the third inverter 53 to the second motor generator 30 are performed, to discharge electrical power from the second power source 61.

As a process of decreasing the acceleration power fed to the second motor generator 30 in this embodiment, a process of varying the second torque command value T2tgt in a direction that decreases the electrical power consumed by the second motor generator 30 is performed. As a process of increasing the acceleration power fed to the second motor generator 30 in this embodiment, a process of varying the third torque command value T3tgt in a direction that increases the electrical power consumed by the second motor generator 30 is performed. The process of Step S32 increases the power discharged from the second power source 61 and can prevent the second power source 61 from entering an overcharged state.

In this embodiment, the second torque command value T2tgt and the third torque command value T3tgt are varied to prevent a variation in the amplitude of the composite vector of the second output voltage vector Vtr2 and the third output voltage vector Vtr3 before and after decreasing the acceleration power fed from the second inverter 52 to the second motor generator 30 and the acceleration power fed from the third inverter 53 to the second motor generator 30.

Note that if a negative determination is made in step S30, it is determined that the first power source 60 and the second power source 61 are not likely to enter an over charged state and an overdischarged state, respectively, and the control states of the first to third inverters 51 to 53 are not changed.

With the charged state control process described above, the first power source 60 and the second power source 61 can be prevented from entering an overdischarged state or an overcharged state.

Second Embodiment

The second embodiment will now be described with focus on the differences with the first embodiment, with reference to the drawings. In this embodiment, the management ECU 85 performs a loss minimizing process of setting the converter voltage command value Vcvout during a step-up operation of the boost converter 50 such that the loss of the drive system is minimized. In this embodiment, the management ECU 85 includes a "voltage setter" and a "loss calculator."

Figure 10:
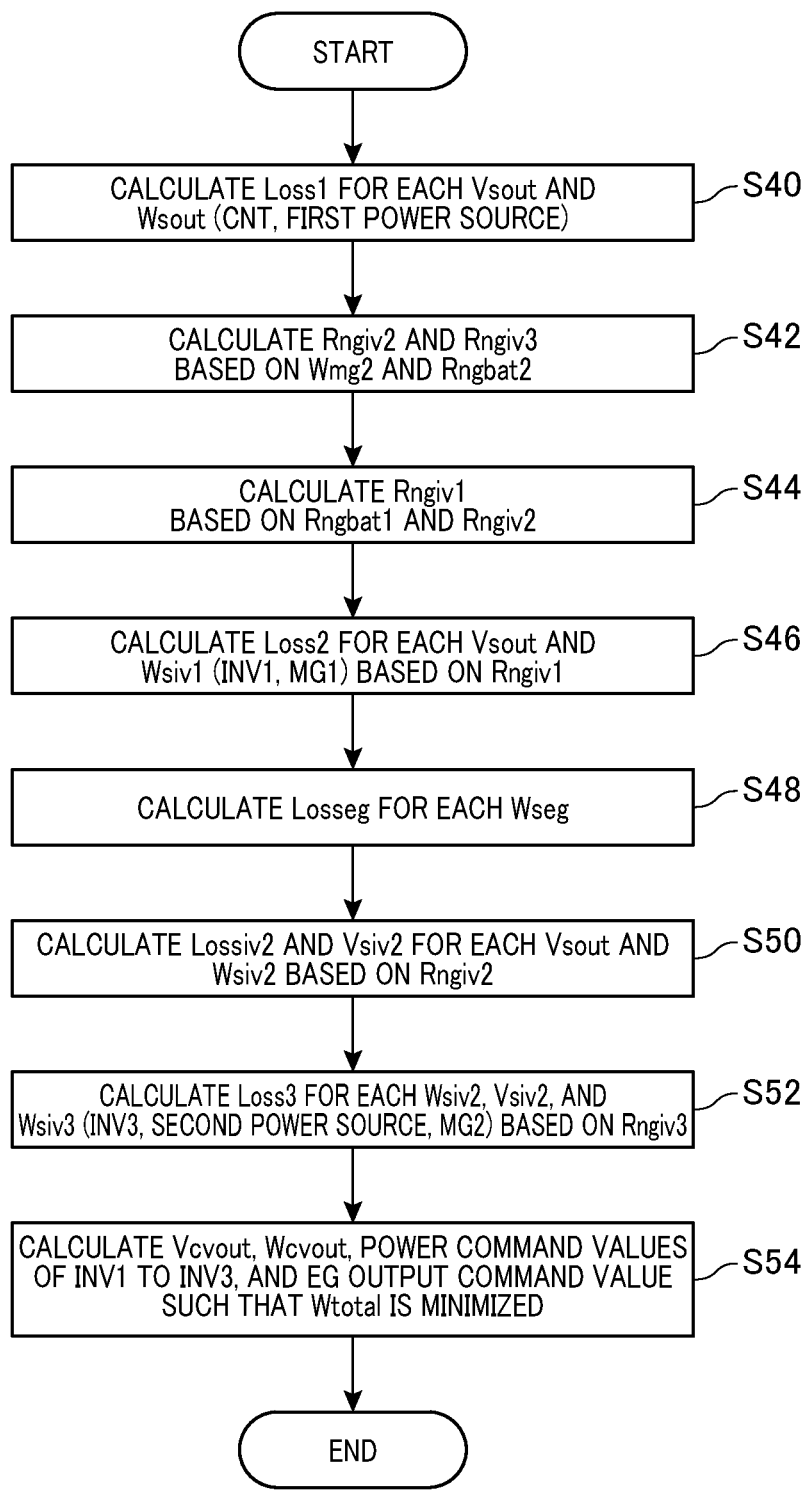
FIG. 10 is a flow chart illustrating the procedures in a loss minimizing process according to a second embodiment.

FIG. 10 illustrates the procedures of the loss minimizing process. This process is, for example, repeatedly performed in a predetermined cycle by the management ECU 85.

In the series of processing, first, in step S40, one of multiple output voltage candidate values Vsout of the boost converter 50 is selected, and one of multiple output power candidate values Wsout of the boost converter 50 is selected. In step S40, the output voltage of the boost converter 50 is the potential difference across the first inverter-side terminal Ci1 and the second inverter-side terminal Ci2, and the output power of the boost converter 50 is the electrical power outputted from the first inverter-side terminal Ci1 and the second inverter-side terminal Ci2. In step S40, a first loss Loss1 is calculated that is presumed to occur when the output voltage of the boost converter 50 is the selected output voltage candidate value Vsout and the output power of the boost converter 50 is the selected output power candidate value Wsout. In this embodiment, the first loss Loss1 is the sum of the loss occurring at the first power source 60 during discharge of the first power source 60 and the loss occurring at the boost converter 50 when the boost converter 50 performs a step-up operation. In step S40 of this embodiment, the first loss Loss1 is calculated for every combination of the multiple output voltage candidate values Vsout and the multiple output power candidate values Wsout.

In this embodiment, the upper limit Vs max of the range of the output voltage candidate values Vsout is set to the product of the first converter voltage Vcnv1, which is the current terminal voltage of the first power source 60, and the maximum step-up ratio of the boost converter 50. Here, the step-up ratio is the ratio "Vout/Vin" of the terminal voltage "Vin" of the first power source 60 to the terminal voltage "Vout" of the second capacitor 50c.

In this embodiment, the upper limit Ws max of the range of the output power candidate values Wsout is set to the product of the upper limit of the range of the output voltage candidate values Vsout and the allowed upper limit of current flowing through the boost converter 50. The allowed upper limit is set to a value that can prevent reduction in reliability of the boost converter 50.

Note that the first loss Loss1 should be calculated on the basis of map information defining the first loss Loss1 in correlation with the output voltage candidate value Vsout and the output power candidate value Wsout, such as in FIG. 11. In FIG. 11, the lower limit of the output voltage candidate values Vsout is denoted as Vs min, and the lower limit of the output voltage candidate values Wsout is denoted as Ws min. The first loss Loss1 tends to increase, for example, as the output voltage candidate value Vsout increases and/or the output power candidate value Wsout increases. The map information illustrated in FIG. 11 should be stored in, for example, a storage unit, such as a memory, provided in the management ECU 85.

Referring back to the description on FIG. 10, in the subsequent step S42, a second required power range Rngiv2 and a third required power range Rngiv3 are calculated on the basis of a second motor required power Wmg2 and a power range Rngbat2 outputable by the second power source 61, the second motor required power Wmg2 being the electrical power consumed by the second motor generator 30 and required during acceleration drive or the electrical power generated by the second motor generator 30 and required during the regenerative drive. In this embodiment, the second required power range Rngiv2 is the range of electrical power transmitted between the second inverter 52 and the second motor generator 30, and the third required power range Rngiv3 is the range of electrical power transmitted between the third inverter 53 and the second motor generator 30. The upper value of the power range Rngbat2 outputable by the second power source 61 is set to a value that can prevent the second power source 61 from entering an overdischarged state. Note that the second motor required power Wmg2 should be calculated on the basis of, for example, the second torque command value T2tgt, the third torque command value T3tgt, and the second rotational rate command value N2tgt.

In the subsequent step S44, a first required power range Rngiv1 that is the range of electrical power transmitted between the first inverter 52 and the first motor generator 20 is calculated on the basis of a power range Rngbat1 outputable by the first power source 60 and the second required power range Rngiv2 calculated in step S42. Here, the upper limit of the first required power range Rngiv1 should be calculated to be the difference between the upper limit of the power range Rngbat1 outputable by the first power source 60 and the upper limit of the second required power range Rngiv2.

In the subsequent step S46, one of the multiple output voltage candidate values Vsout of the boost converter 50 is selected, and one of multiple first power candidate values Wsiv1 is selected. In step S46, the first power candidate values Wsiv1 are candidate values of the electrical power transmitted between the first inverter 51 and the first motor generator 20. The upper limit and the lower limit among the multiple first power candidate values Wsiv1 are included in the first required power range Rngiv1 calculated in step S44. In this embodiment, the upper limit of the multiple first power candidate values Wsiv1 is set to be the upper limit of the first required power range Rngiv1, and the lower limit of the multiple first power candidate values Wsiv1 is set to be the lower limit of the first required power range Rngiv1.

Then, in step S46, a second loss Loss2 is calculated that is presumed to occur when the output voltage of the boost converter 50 is set to the selected output voltage candidate value Vsout and when the electrical power transmitted between the first inverter 51 and the first motor generator 20 is set to the selected first power candidate value Wsiv1. In this embodiment, the second loss Loss2 is the sum of the losses that occur at the first inverter 51 and the first motor generator 20 when electrical power is transmitted between the first inverter 51 and the first motor generator 20. In step S46 of this embodiment, the second loss Loss2 is calculated for every combination of the multiple output voltage candidate values Vsout and the multiple first power candidate values Wsiv1.

Note that, in this embodiment, the second loss Loss2 should be calculated on the basis of map information defining the second loss Loss2 in correlation with the output voltage candidate value Vsout and the first power candidate value Wsiv1, such as in FIG. 12. In FIG. 12, the lower limit of the first power candidate values Wsiv1 is denoted as Ws1min, and the upper limit of the first power candidate values Wsiv1 is denoted as Ws1max. The map information illustrated in FIG. 12 should be prepared, for example, on the basis of the characteristics of the first motor generator 20 and the first inverter 51. Furthermore, the map information illustrated in FIG. 12 should be stored, for example, in the above-described storage unit.

Referring back to the description on FIG. 10, in the subsequent step S48, one of multiple engine output candidate values Wseg of the engine 10 is selected. Then, an engine loss Losseg is calculated that is the loss presumed to occur at the engine 10 when the output of the engine 10 is the selected engine output candidate values Wseg. In step S48 of this embodiment, the engine loss Losseg is calculated for every engine output candidate value Wseg.

Note that the engine loss Losseg should be calculated on the basis of map information defining the engine loss Losseg in correlation with the engine output candidate value Wseg, such as in FIG. 13. In FIG. 13, the lower limit of the output engine output candidate values Wseg is denoted as Wse min, and the upper limit of the engine output candidate values Wseg is denoted as Wse max. The map information illustrated in FIG. 13, for example, should be stored in the above-described storage unit.

Referring back to the description on FIG. 10, in the subsequent step S50, one of the multiple output voltage candidate values Vsout of the boost converter 50 is selected, and one of multiple second power candidate values Wsiv2 is selected. In step S50, the second power candidate values Wsiv2 are candidate values of the electrical power transmitted between the second inverter 52 and the second motor generator 30. The upper limit and the lower limit among the multiple second power candidate values Wsiv2 are included in the second required power range Rngiv2 calculated in step S42. In this embodiment, the upper limit of the multiple second power candidate values Wsiv2 is set to the upper limit of the second required power range Rngiv2, and the lower limit of the multiple second power candidate values Wsiv2 is set to the lower limit of the second required power range Rngiv2.

Then, in step S50, a second inverter loss Lossiv2 that is presumed to occur and a possible second inverter voltage Vsiv2 of the output voltage of the second inverter 52 are calculated for when the output voltage of the boost converter 50 is the selected output voltage candidate value Vsout and when the electrical power transmitted between the second inverter 52 and the second motor generator 30 is the selected second power candidate values Wsiv2. In this embodiment, the second inverter loss Lossiv2 is the loss that occurs at the second inverter 52 when electrical power is transmitted between the second inverter 52 and the second motor generator 30. Furthermore, in this embodiment, the second inverter voltage Vsiv2 is the amplitude of an AC voltage applied from the second inverter 52 to the second motor generator 30. In step S50 of this embodiment, the second inverter loss Lossiv2 and the second inverter voltage Vsiv2 are calculated for every combination of the multiple output voltage candidate values Vsout and the multiple second power candidate values Wsiv2.

Note that, in this embodiment, the second inverter loss Lossiv2 and the second inverter voltage Vsiv2 should be calculated on the basis of map information defining the second inverter loss Lossiv2 and the second inverter voltage Vsiv2 in correlation with the output voltage candidate values Vsout and the second power candidate values Wsiv2, such as in FIG. 14. In FIG. 14, the lower limit of the second power candidate values Wsiv2 is denoted as Ws2min, and the upper limit of the second power candidate values Wsiv2 is denoted as Ws2max. The map information illustrated in FIG. 14 should be prepared, for example, on the basis of the characteristics of the second motor generator 30 and the second inverter 52. Furthermore, the map information illustrated in FIG. 14 should be stored, for example, in the above-described storage unit.

Referring back to the description on FIG. 10, in the subsequent step S52, one of multiple second power candidate values Wsiv2 is selected. One of the possible second power candidate values Wsiv2 is selected for when the electrical power transmitted between the second inverter 52 and the second motor generator 30 is the second power candidate values Wsiv2 selected in step S52 from the multiple second inverter voltages Vsiv2 calculated in step S50. Furthermore, one of multiple third power candidate values Wsiv3 is selected. In step S52, the third power candidate values Wsiv3 are candidate values of the electrical power transmitted between the third inverter 53 and the second motor generator 30. The upper limit and the lower limit among the multiple third power candidate values Wsiv3 are included in the third required power range Rngiv3 calculated in step S42.

Then, in step S52, a third loss Loss3 is calculated that is presumed to occur when the electrical power transmitted between the second inverter 52 and the second motor generator 30 is the selected second power candidate values Wsiv2, the output voltage of the second inverter 52 is the selected second inverter voltage Vsiv2, and the electrical power transmitted between the third inverter 53 and the second motor generator 30 is the selected third power candidate values Wsiv3. In this embodiment, the third loss Loss3 is the sum of the losses occurring at the second power source 61 during discharge of the second power source 61 and the losses occurring at the third inverter 53 and the second motor generator 30 when electrical power is transmitted between the third inverter 53 and the second motor generator 30. In step S52 of this embodiment, the third loss Loss3 is calculated for every combination of the multiple output voltage candidate value Vsout, the multiple second inverter voltage Vsiv2, and the multiple third power candidate values Wsiv3.

Note that the third loss Loss3 should be calculated on the basis of map information defining the third loss Loss3 in correlation with the second power candidate value Wsiv2, the second inverter voltage Vsiv2, and the third power candidate value Wsiv3, such as in FIG. 15. In FIG. 15, the lower limit of the second inverter voltage Vsiv2 is denoted as Vs2min, and the upper limit of the second inverter voltage Vsiv2 is denoted as Vs2max. Furthermore, the map information illustrated in FIG. 15 should be stored, for example, in the above-described storage unit.

Referring back to the description of FIG. 10, in the subsequent step S54, the output voltage candidate value Vsout and the output voltage candidate value Wsout are selected such that the total loss Wtotal is minimized, the total loss Wtotal being the sum of the first loss Loss1 calculated in step S40, the second loss Loss2 calculated in step S46, the engine loss Losseg calculated in step S48, the second inverter loss Lossiv2 calculated in step S50, and the third loss Loss3 calculated in step S52. Then, the selected output voltage candidate value Vsout is set to be the converter voltage command value Vcvout, and the selected output power candidate value Wsout is set to be the converter power command value Wcvout. Furthermore, a first power command value that is a command value for the electrical power transmitted between the first inverter 51 and the first motor generator 20, a second power command value that is a command value for the electrical power transmitted between the second inverter 52 and the second motor generator 30, a third power command value that is a command value for the electrical power transmitted between the third inverter 53 and the second motor generator 30, and an engine output command value that is a command value for the output from the engine 10 are set on the basis of the selected output voltage candidate value Vsout. Then, the first torque command value T1tgt and the first rotational rate command value N1tgt defining the operating point of the first motor generator 20 is set on the basis of the first command value, and the second torque command value T2tgt, the third torque command value T3tgt, and the second rotational rate command value N2tgt defining the operating point of the second motor generator 30 are set on the basis of the second command value and the third command value. Furthermore, the engine torque command value Tetgt and the engine rotational rate command value Netgt defining the operating point of the engine 10 are set on the basis of the engine output command value.

According to the above-described embodiment, the output voltage of the boost converter 50, the operating points of the motor generators 20 and 30 and the operating point of the engine 10 can be determined such that the total loss Wtotal is minimized. In this way, losses occurring in the drive system can be reduced.

Third Embodiment

The third embodiment will now be described with focus on the differences with the second embodiment, with reference to the drawings. In this embodiment, the management ECU 85 performs a process of stopping the operation of the boost converter 50 when the set converter voltage command value Vcvout exceeds a step-up limit voltage V max. In this embodiment, the step-up limit voltage V max is set to be the product of the possible maximum value (for example, 1.5) of the step-up ratio of the boost converter 50 and the possible maximum value of the output voltage of the first power source 60. In this embodiment, the step-up limit voltage V max is set smaller than the possible maximum value of the regenerative voltage output from the first high-potential-side terminal CH1 and the first low-potential-side terminal CL1 of the first inverter 51 and the possible maximum value of the regenerative generation voltage output from the second high-potential-side terminal CH2 and the second low-potential-side terminal CL2 of the second inverter 52.

Figure 16:
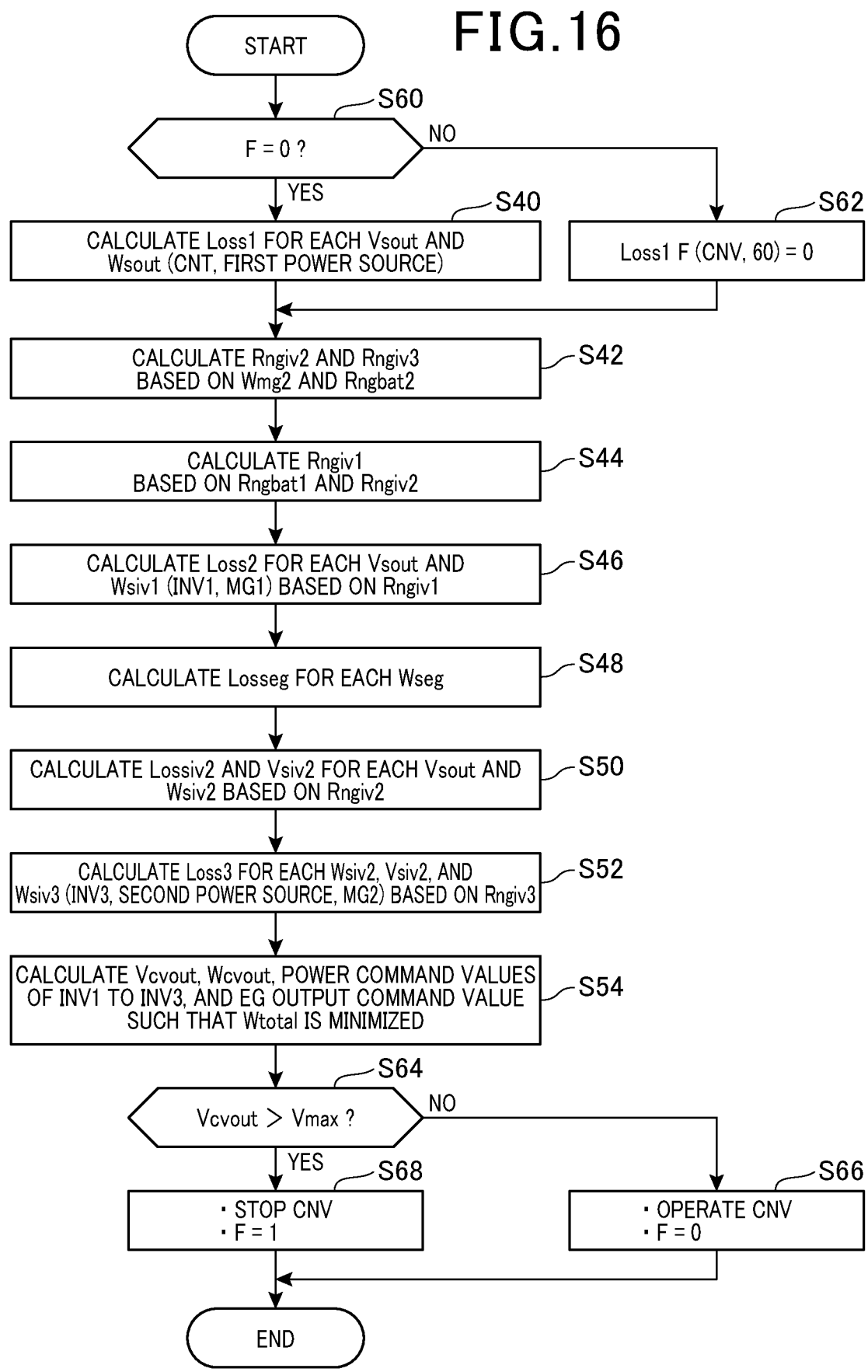
FIG. 16 is a flow chart illustrating the procedures in a process of stopping the boost converter according to a third embodiment.

FIG. 16 illustrates the procedure of the process of stopping the boost converter 50. This process is, for example, repeatedly performed in a predetermined cycle by the management ECU 85. Note that in FIG. 16, the processes that are the same as those illustrated in FIG. 10 will be denoted by the same step numbers.

In this series of processing, first, in step S60, it is determined whether the value of a determination flag F is 0. The determination flag F is set to 1 to indicate that the operation of the boost converter 50 is stopped and set to 0 to indicate that the boost converter 50 is in operation. Note that in this embodiment, the initial value of the determination flag F is 0.

If an affirmative determination is made in step S60, the process proceeds to step S40. In contrast, if a negative determination is made in step S60, the process proceeds to step S62, and the first loss Loss1 is calculated to be zero. After steps S40 and S62 end, the process proceeds to step S42.

After step S54 is completed, the process proceeds to step S64, and it is determined whether the converter voltage command value Vcvout set in step S54 exceeds the step-up limit voltage V max. If a negative determination is made in step S64, the process proceeds to step S66, the boost converter 50 continues operating, and the determination flag F is set to 0.

In contrast, if an affirmative determination is made in step S64, the process proceeds to step S68, the operation of the boost converter 50 is stopped, and the determination flag F is set to "1."

In this way in this embodiment, if the converter voltage command value Vcvout set in step S54 is determined to exceed the step-up limit voltage V max, the operation of the boost converter 50 is stopped. Thus, the output voltage of the boost converter 50 is no longer controlled, and thus the management ECU 85 can increase the generation voltage of the first motor generator 20 or the second motor generator 30 without being limited by the control. In this way, the current flowing through the electrical paths LH1 and LL1 can be reduced when power is transmitted between the boost converter 50 and the first motor generator 20 via the first inverter 51, and copper loss that occurs due to the flow of the current through the electrical paths LH1 and LL1 can be reduced. Furthermore, when electrical power is transmitted between the boost converter 50 and the second motor generator 30 via the second inverter 52, the current flowing through the electrical paths LH2 and LL2 can be reduced, and copper loss caused by a current flowing through the electrical paths LH2 and LL2 can be reduced.

Fourth Embodiment

Figure 17:
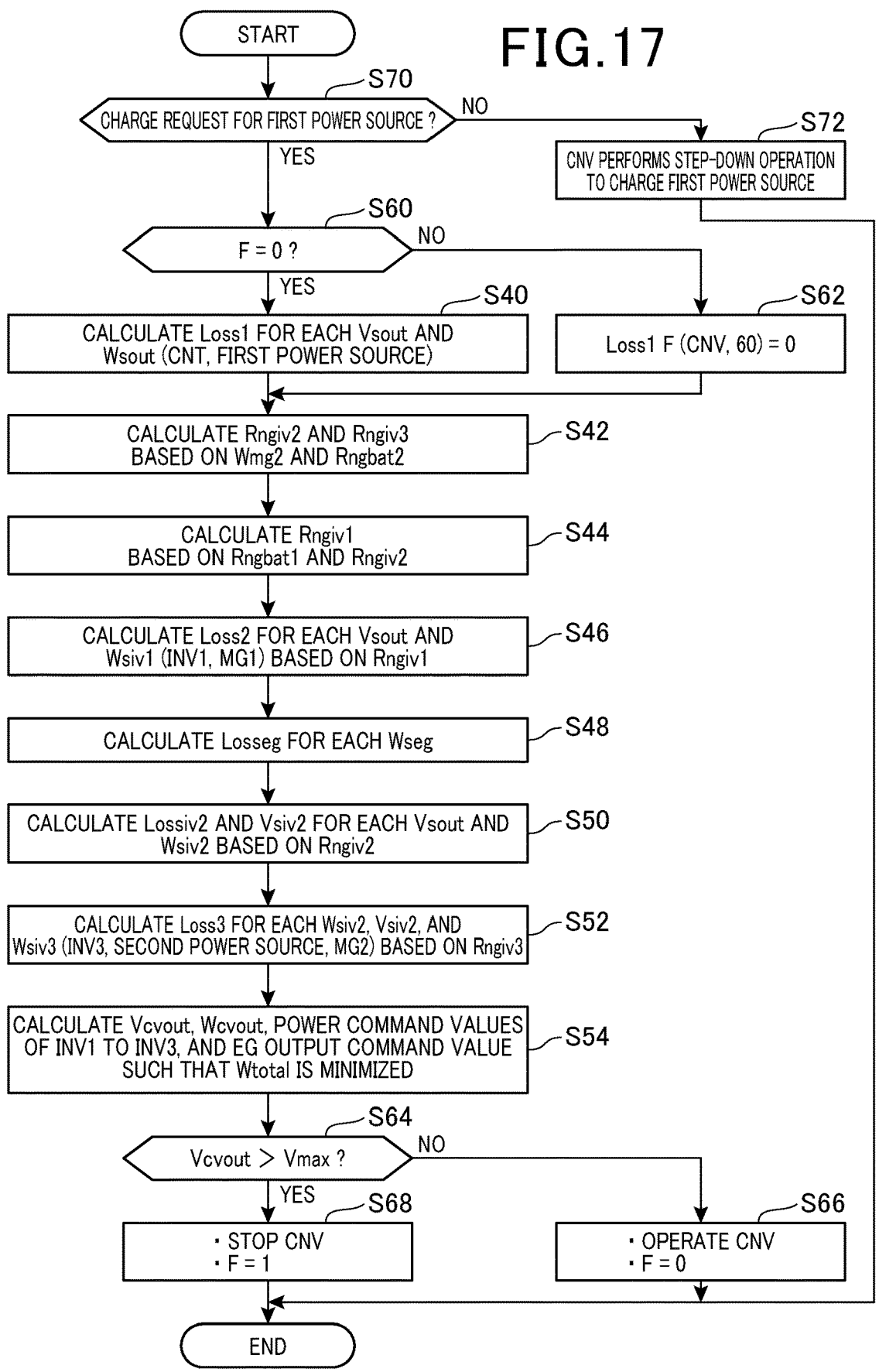
FIG. 17 is a flow chart illustrating the procedures in a process of stopping the boost converter according to a fourth embodiment.

The fourth embodiment will now be described with focus on the differences with the third embodiment, with reference to the drawings. In this embodiment, when there is a charge request for the first power source 60, the management ECU 85 performs a process of instructing the boost converter 50 to perform a step-down operation to charge the first power source 60. FIG. 17 illustrates the procedures of the process. This process is, for example, repeatedly performed in a predetermined cycle by the management ECU 85. Note that in FIG. 17, the processes that are the same as those illustrated in FIG. 16 will be denoted by the same step numbers.

In this series of processing, first, in step S70, it is determined whether there is a charge request for the first power source 60. Here, for example, a charge request for the first power source 60 should be determined when the first charging rate SOC1 is determined to be smaller than or equal to the first overdischarge threshold SLth1. Note that in this embodiment, the process in step S70 is equivalent to a "request determiner."

If no charge request is determined in step S70, the process proceeds to step S60. In contrast, if a charge request is determined in step S70, the process proceeds to step S72. In step S72, the boost converter 50 performs a step-down operation to charge the first power source 60. At this time, the first and second inverters 51 and 52 are controlled to adjust the regenerative generation power of the first and second motor generators 20 and 30 such that the second converter voltage Vcnv2, which is the terminal voltage of the second capacitor 50c, to be smaller than or equal to the step-up limit voltage V max. In this way, the boost converter 50 can perform a step-down operation.

According to the above-described embodiment, the first power source 60 can be prevented from entering an overdischarged state.

Fifth Embodiment

The fifth embodiment will now be described with focus on the differences with the second embodiment, with reference to the drawings. In this embodiment, when it is determined that a configuration device of the drive system is in an overheated state, the management ECU 85 performs an overheated-state prevention process of reducing the temperature of the device determined to be in an overheated state.

Figure 18:
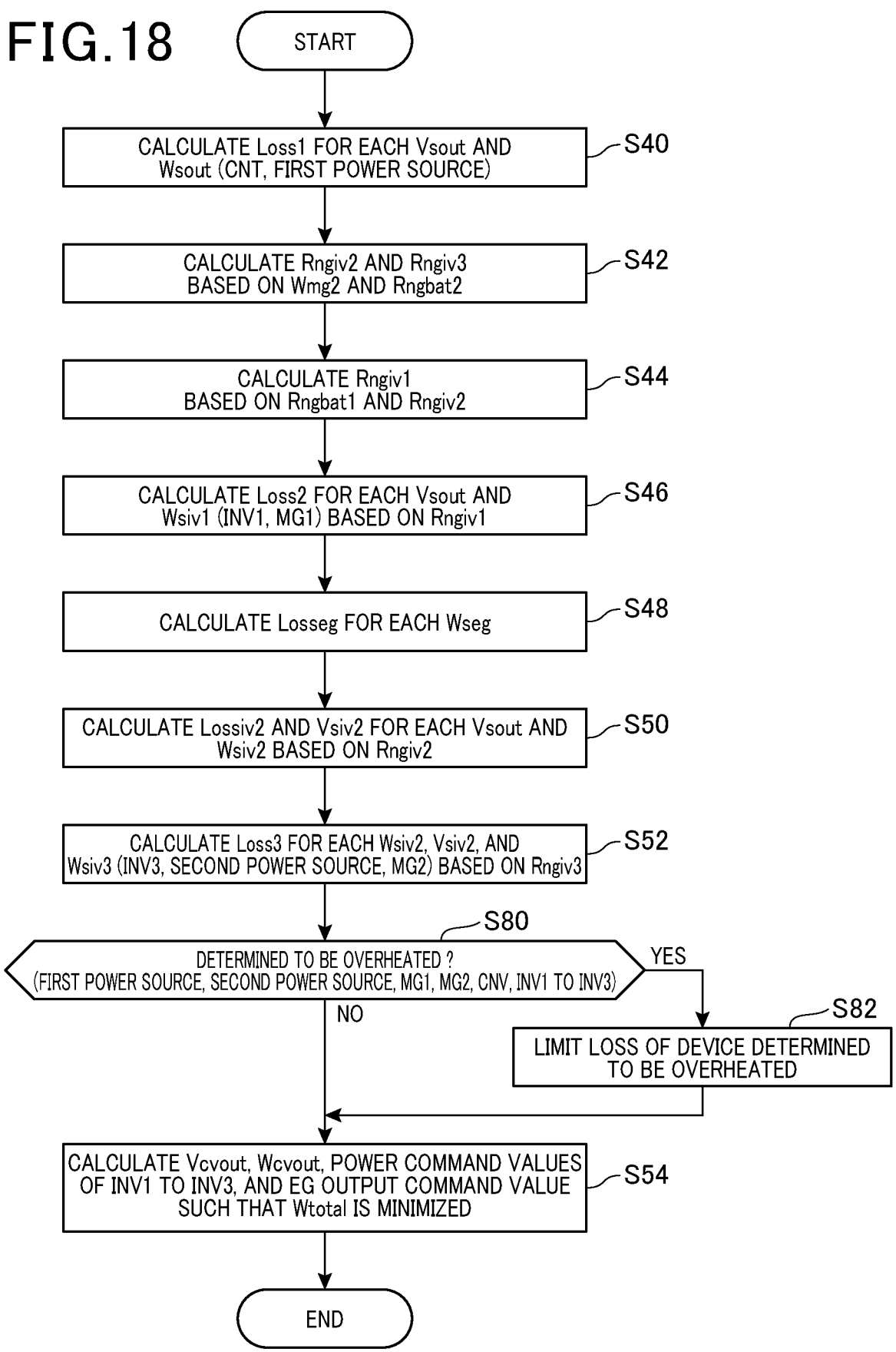
FIG. 18 is a flow chart illustrating the procedures in a process of preventing an overheated state according to a fifth embodiment.

FIG. 18 illustrates the procedures of the overheated state prevention process. This process is, for example, repeatedly performed in a predetermined cycle by the management ECU 85. Note that in FIG. 18, the processes that are the same as those illustrated in FIG. 10 will be denoted by the same step numbers.

In this series of processes, in step S80 after completing the process in step S52, it is determined whether any of the devices is in an overheated state among the first power source 60, the second power source 61, the first motor generator 20, the second motor generator 30, the boost converter 50, the first inverter 51, the second inverter 52, and the third inverter 53. In specific, when at least one of the acquired temperature detection value TT1 of the first power source 60, the temperature detection value TT2 of the second power source 61, the temperature detection value TM1 of the first motor generator 20, the temperature detection value TM2 of the second motor generator 30, the temperature detection value Tcnv of the boost converter 50, the temperature detection value Tiv1 of the first inverter 51, the temperature detection value Tiv2 of the second inverter 52, and the temperature detection value Tiv3 of the third inverter 53 exceeds an overheat threshold, it is determined that a device is in an overheated state.

If no device is determined to be in an overheated state in step S80, the process proceeds to step S54. In contrast, if a device is determined to be in an overheated state in step S80, the process proceeds to step S82. In step S82, the loss of the device determined to be in an overheated state is forcibly reduced during calculation of the first loss Loss1, the second loss Loss2, the third loss Loss3, and the second inverter loss Lossiv2 in steps S40 to S52.

Here, for example, if the first power source 60 is determined to be in an overheated state, the output power of the first power source 60 is reduced and the output power of the second power source 61 can be increased by the amount of the reduced power. In this way, a variation in the output of the second motor generator 30 can be prevented.

According to the above-described embodiment, devices constituting the drive system can be prevented from entering an overheated state, and the service life of the devices can be prevented from being reduced.

Sixth Embodiment

The sixth embodiment will now be described with focus on the differences with the fifth embodiment, with reference to the drawings. In this embodiment, when it is determined that a configuration device of the drive system is in a low-temperature state, the management ECU 85 performs a lower-temperature-state prevention process of increasing the temperature of the device determined to be in a low temperature state.

Figure 19:
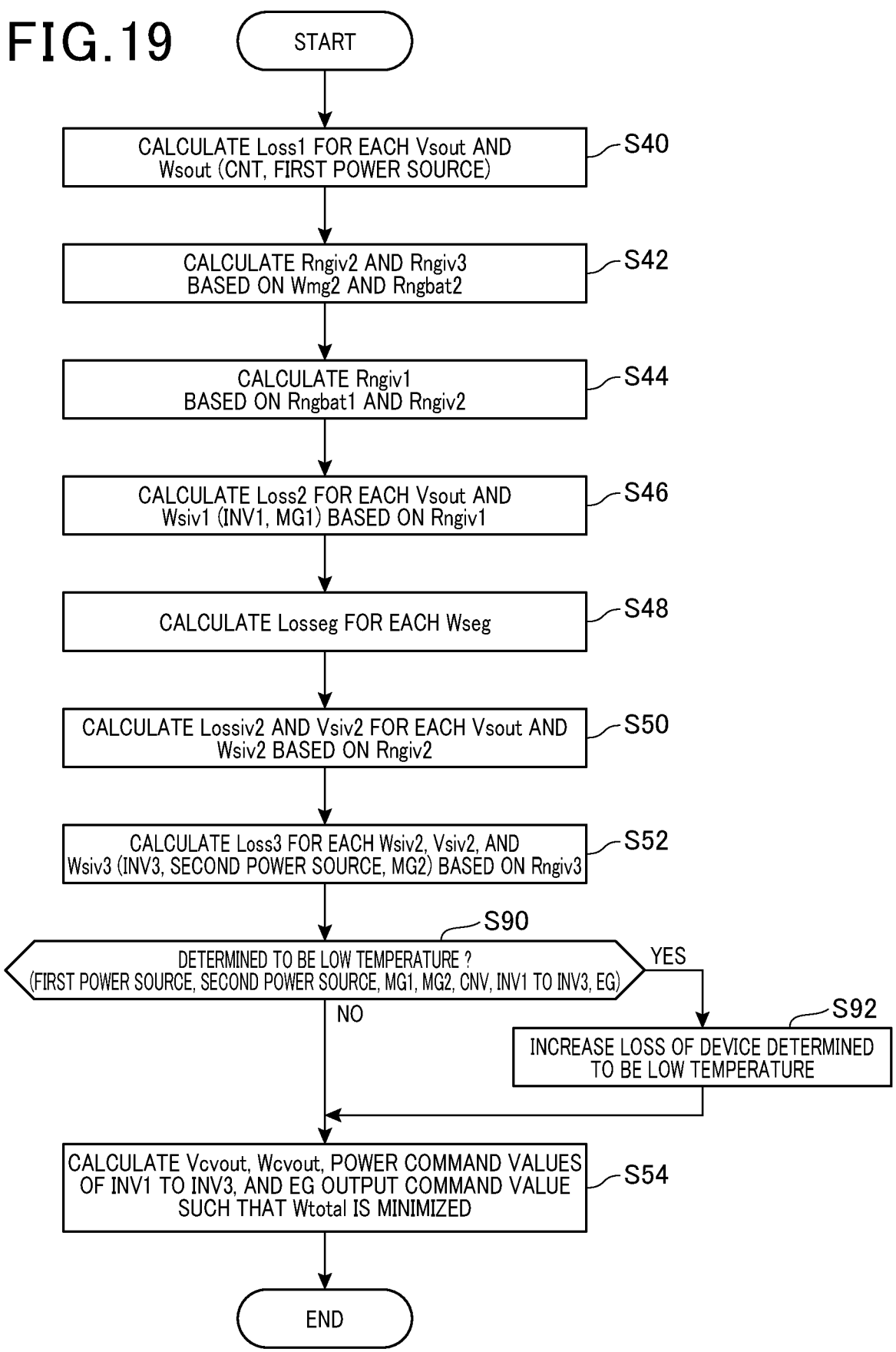
FIG. 19 is a flow chart illustrating the procedures in a process of preventing a low temperature state according to a sixth embodiment.

FIG. 19 illustrates the procedures of the low-temperature state prevention process. This process, for example, is repeatedly performed in a predetermined cycle by the management ECU 85. Note that in FIG. 19, the processes that are the same as those illustrated in FIG. 10 will be denoted by the same step numbers.

In this series of processing, in step S90 after completing the process in step S52, it is determined whether any of the devices is in a low-temperature state among the first power source 60, the second power source 61, the first motor generator 20, the second motor generator 30, the boost converter 50, the first inverter 51, the second inverter 52, the third inverter 53, and the engine 10. Specifically, when at least one of the acquired temperature detection value TT1 of the first power source 60, the temperature detection value TT2 of the second power source 61, the temperature detection value TM1 of the first motor generator 20, the temperature detection value TM2 of the second motor generator 30, the temperature detection value Tcnv of the boost converter 50, the temperature detection value Tiv1 of the first inverter 51, the temperature detection value Tiv2 of the second inverter 52, and the temperature detection value Tiv3 of the third inverter 53 is below a low-temperature threshold, it is determined that a device is in a low-temperature state. Here, the low-temperature threshold is set to a value smaller than the overheat threshold in the above-described fifth embodiment.

If no device is determined to be in a low-temperature state in step S90, the process proceeds to step S54. In contrast, if a device is determined to be in a low-temperature state in step S90, the process proceeds to step S92. In step S92, the loss of the device determined to be in a low-temperature state is increased during calculation of the first loss Loss1, the second loss Loss2, the third loss Loss3, and the second inverter loss Lossiv2 in steps S40 to S52. For example, if the engine 10 is determined to be in a low-temperature state, the loss of the engine 10 is increased to rise the temperature of the engine 10. In this way, the viscous resistance can be reduced when the output shaft 10a and other components of the engine 10 are rotated.

Note that when it is determined that the first power source 60 and the second power source 61 are in a low-temperature state, the boost converter 50, the second inverter 52, and the third inverter 53 may be controlled such that charge and discharge are alternately performed the first power source 60 and the second power source 61 while the vehicle is in a parking mode. In this way, the temperatures of the first power source 60 and the second power source 61 are increased.

According to the above-described embodiment, devices constituting the drive system can be prevented from entering a low-temperature state, and reduction in reliability of the device can be prevented.

Other Embodiments

Note that the above-described embodiments may be modified and implemented as follows.

An electrical path having a switch may be disposed between the third inverter 53 and the first motor generator 20 illustrated in FIG. 1. In such a case, when the switch is to be turned on to apply the output voltage of the second power source 61 to the third inverter 53 and the first power source 60 is charged by the first motor generator 20, for example, the management ECU 85 may control the switch such that the switch is turned off to prevent current circulation. In such a case also, the second power source 61 and the first motor generator 20 are connected via a single connecting route when the first power source 60 is charged by the first motor generator 20 as well as when the second power source 61 is charged by the second motor generator 30.

In the above-described second embodiment, the sum of the losses occurring at the boost converter 50, the inverters 51 to 53, the motor generators 20 and 30, and the engine 10 is calculated when the converter voltage command value Vcvout is to be set. However, it is not limited thereto. For example, the sum of the losses occurring at some and at least one of the boost converter 50, the inverters 51 to 53, the motor generators 20 and 30, and the engine 10 may be calculated when the converter voltage command value Vcvout is to be set.

Alternatively, in the above-described fifth embodiment, the sum of the losses occurring at some and at least one of the first power source 60, the second power source 61, the boost converter 50, the inverters 51 to 53, and the motor generators 20 and 30 may be calculated when the converter voltage command value Vcvout is to be set. In such a case, for example, the management ECU 85 may set the output voltage candidate value Vsout to be the converter voltage command value Vcvout such that the sum of the losses of the devices that are determined to be in an overheated state is minimized, among the first power source 60, the second power source 61, the first motor generator 20, the second motor generator 30, the boost converter 50, the first inverter 51, the second inverter 52, and the third inverter 53. An example of this setting method will now be described with reference to FIG. 20.

In the example illustrated in FIG. 20, the management ECU 85 determines that at least one of the first inverter 51 and the first motor generator 20 is in an overheated state. In such a case, the management ECU 85 sets the converter voltage command value Vcvout to be the output voltage candidate value Vsout that derives the minimum second loss Loss2 among the calculated second losses Loss2, not the output voltage candidate value Vsout that derives the minimum total loss Wtotal among the calculated total losses Wtotal.

In the above-described sixth embodiment, the losses occurring at some and at least one of the first power source 60, the second power source 61, the boost converter 50, the inverters 51 to 53, the motor generators 20 and 30, and the engine 10 may be calculated when the converter voltage command value Vcvout is to be set. In such a case, for example, the management ECU 85 may set the output voltage candidate value Vsout to the converter voltage command value Vcvout such that the sum of the losses of the devices that are determined to be in a low-temperature state is maximized, among the first power source 60, the second power source 61, the first motor generator 20, the second motor generator 30, the boost converter 50, the first inverter 51, the second inverter 52, the third inverter 53, and the engine 10. An example of this setting method will now be described with reference to FIG. 21.

In the example illustrated in FIG. 21, the management ECU 85 determines that at least one of the boost converter 50 and the first power source 60 is in a low temperature state. In such a case, the management ECU 85 sets the converter voltage command value Vcvout to the output voltage candidate value Vsout that derives the maximum first loss Loss1 among the calculated first losses Loss1, not the output voltage candidate value Vsout that derives the minimum total loss Wtotal among the calculated total losses Wtotal, even when the total loss Wtotal is the second smallest value.

In the above-described fifth embodiment, the target of determination of an overheated state may be some and at least one of the first power source 60, the second power source 61, the first motor generator 20, the second motor generator 30, the boost converter 50, the first inverter 51, the second inverter 52, and the third inverter 53. In FIG. 13 described above, whether the device is in an overheated state may be determined before step S40.

In the above-described sixth embodiment, the target to be determined to be in a low-temperature state may be some and at least one of the first power source 60, the second power source 61, the first motor generator 20, the second motor generator 30, the boost converter 50, the first inverter 51, the second inverter 52, the third inverter 53, and the engine 10. In the above-described sixth embodiment, for example, the engine 10 may be omitted from the target of a low-temperature state. In FIG. 14 described above, whether the device is in a low-temperature state may be determined before step S40.

In the embodiments described above, the power sources used as the first and second power sources may be any combination besides a secondary battery and a capacitor. An example of such a combination is a primary battery such as a fuel cell and a secondary battery.

Here, an example of a different type of power source includes a fuel cell can be used as the second power source and a secondary battery can be used as the first power source. In such a case, the first power source can be charged with regenerative power.

The first power source 60 and the second power source 61 may be, for example, nickel-metal hydride rechargeable batteries besides lithium-ion rechargeable batteries. Furthermore, the power source may be a primary battery, such as a fuel cell, besides a secondary battery.

The rotating electrical machine may be, for example, of a field-winding type besides of a permanent magnet field type. Furthermore, the rotating electrical machine may be, for example, an induction machine besides a synchronous machine.

The vehicle may include only motor generators as driving power sources and not include an engine.

The drive system is not limited to one mounted on a vehicle.

Although the present disclosure has been described in accordance with embodiments, it should be understood that the present disclosure is not limited to the embodiments and structures. The present disclosure also includes various modifications and variations within the equal scope. In addition, various combinations and forms, and also other combinations and forms including only one element, or more, or less than these elements are within the scope and the spirit of the present disclosure.

What is claimed is:

1. A drive system including a first AC rotating electrical machine and a second AC electrical machine, the drive system comprising:
   a first inverter electrically connected to the first AC rotating electrical machine and driving the first AC rotating electrical machine;
   a second inverter electrically connected to a first end of the two ends of each phase coil constituting the second AC rotating electrical machine and driving the second AC rotating electrical machine;
   a boost converter including a power-source-side connector electrically connectable to a first DC power source and electrically connected to an inverter-side connector electrically connected to the first inverter via a first electrical path and the second inverter via a second electrical path, the boost converter stepping up an output voltage of the first DC power source and outputting the stepped up output voltage to the first inverter and the second inverter; and
   a third inverter electrically connected to a second end side of the two ends of each phase coil constituting the second AC rotating electrical machine and driving the second AC rotating electrical machine by transmitting electrical power between the third inverter and a second DC power source different from the first DC power source, wherein
   the second DC power source and the first AC rotating electrical machine are configured to be connected via a single connecting path,
   the drive system further includes a processor that performs a process of changing a control state of at least one of the first inverter, the second inverter, the third inverter, and the boost converter based on the state of at least one of the first inverter, the second inverter, the third inverter, the boost converter, the first DC power source, and the second DC power source, wherein
   a threshold for determining an overdischarged state of the first DC power source is set to be a first overdischarge threshold,
   a threshold for determining an overcharged state of the second DC power source is set to be a second overcharge threshold,
   the processor acquires a first charging rate that is a charging rate of the first DC power source as a state of the first DC power source and a second charging rate that is a charging rate of the second DC power source as a state of the second DC power source, and
   when the processor determines that the first charging rate is smaller than or equal to the first overdischarge threshold and the second charging rate is larger than or equal to the second overcharge threshold, the processor performs, as a process of changing the control state, a process of increasing electrical power fed from the second DC power source to the second AC rotating electrical machine via the third inverter and increasing generated power fed from the second AC rotating electrical machine to the first DC power source via the second inverter such that the first DC power source is charged by electrical power discharged from the second DC power source.

2. The drive system according to claim 1, wherein
   when the processor determines that the first charging rate is smaller than or equal to the first overdischarge threshold and the second charging rate is smaller than the second overcharge threshold, the processor performs, as a process of changing the control state, a process of increasing generated electrical power fed from the first AC rotating electrical machine to the first inverter such that the first DC power source is charged with power generated at the first AC rotating electrical machine.

3. The drive system according to claim 1, wherein
a threshold for determining an overcharged state of the first DC power source is set to be a first overcharge threshold,
a threshold for determining an overdischarged state of the second DC power source is set to be a second overdischarge threshold,
when the processor determines that the first charging rate is larger than or equal to the first overcharge threshold and the second charging rate is smaller than or equal to the second overdischarge threshold, the processor performs, as a process of changing the control state, a process of increasing electrical power fed from the second inverter to the second AC rotating electrical machine and increasing generated power fed from the second AC rotating electrical machine to the third inverter such that the second DC power source is charged with electrical power discharged from the first DC power source.

4. The drive system according to claim 1, wherein
a threshold for determining an overcharged state of the first DC power source is set to be a first overcharge threshold,
a threshold for determining an overdischarged state of the second DC power source is set to be a second overdischarge threshold, and
when the processor determines that the first charging rate is larger than or equal to the first overcharge threshold and the second charging rate is larger than the second overdischarge threshold, the processor performs, as a process of changing the control state, at least one of a process of decreasing generated electrical power fed from the first AC rotating electrical machine to the first inverter such that the electrical power is discharged from the first DC power source and a process of increasing electrical power fed from the second inverter to the second AC rotating electrical machine such that electrical power is discharged from the first DC power source.

5. The drive system according to claim 1, wherein
a threshold for determining an overdischarged state of the first DC power source is set to be a first overdischarge threshold, and a threshold for determining an overcharged state of the first DC power source larger than the first overdischarge threshold is set to be a first overcharge threshold,
a threshold for determining an overcharged state of the second DC power source is set to be a second overcharge threshold, and
when the processor determines that the first charging rate is larger than the first overdischarge threshold and smaller than the first overcharge threshold and that the second charging rate is larger than or equal to the second overcharge threshold, the processor performs, as a process of changing the control state, a process of decreasing electrical power fed from the second inverter to the second AC rotating electrical machine and increasing electrical power fed from the third inverter to the second AC rotating electrical machine such that the second DC power discharges electrical power.

6. The drive system according to claim 1, wherein
a threshold for determining an overdischarged state of the first DC power source is set to be a first overdischarge threshold, and a threshold for determining an overcharged state of the first DC power source larger than the first overdischarge threshold is set to be a first overcharge threshold,
a threshold for determining an overdischarged state of the second DC power source is set to be a second overdischarge threshold, and
when the processor determines that the first charging rate is larger than the first overdischarge threshold and smaller than the first overcharge threshold and that the second charging rate is smaller than or equal to the second overdischarge threshold, the processor performs, as a process of changing the control state, a process of increasing generated electrical power fed from the second AC rotating electrical machine to the third inverter such that the second DC power is charged with electrical power generated by the second AC rotating electrical machine.

7. The drive system according to claim 1, wherein
the drive system is mounted on a vehicle,
the second AC rotating electrical machine is connected to a wheel of the vehicle such that power is transmittable, and
the processor performs a process of changing the control state such that torque of the second AC rotating electrical machine does not vary before and after performing the process of changing the control state.

8. The drive system according to claim 1, further comprising:
a voltage setter that sets the voltage of the inverter-side connector of the boost converter to each voltage candidate value; and
a loss calculator that calculates a loss presumed to occur in at least one of the boost converter, the first inverter, the second inverter, the third inverter, the first AC rotating electrical machine, and the second AC rotating electrical machine when the voltage of the inverter-side connector is the voltage candidate value set by the voltage setter,
wherein the processor performs, as a process of changing the control state, a process of setting the voltage candidate value corresponding to the minimum loss among the losses calculated by the loss calculator for each voltage candidate value to be a converter voltage command value and controlling the boost converter such that the voltage of the inverter-side connector approaches the boost converter voltage command value.

9. The drive system according to claim 8, wherein
when the voltage of the inverter-side connector is the voltage candidate value set by the voltage setter, the loss calculator calculates a total loss including losses occurring in the boost converter, the first inverter, the second inverter, the third inverter, the first AC rotating electrical machine, and the second AC rotating electrical machine.

10. The drive system according to claim 1, wherein
a ratio of the voltage of the power-source-side connector to a voltage of the inverter-side connector is defined to be a step-up ratio of the boost converter, a step-up limit voltage is smaller than a possible maximum value of an applied voltage of the inverter-side connector, the step-up limit voltage being the product of a possible maximum value of the step-up ratio of the boost converter and a possible maximum value of output voltage of the first DC power source, and when generated electrical power is fed from one of the first AC rotating electrical machine and the second AC rotating electrical machine to the other one, the processor performs, as a process of changing the control state, a process of stopping an operation of the boost converter when the applied voltage of the inverter-side connector exceeds the step-up limit voltage.

11. The drive system according to claim 10, further comprising:

a request determiner that determines whether there is a charge request for the first DC power source, wherein the boost converter is configured to be able to perform a step-down operation to step down a DC voltage input from the inverter-side connector and feed the stepped-down DC voltage from the power-source-side connector to the first DC power source, and when the processor determines a charge request from the request determiner, the processor controls generated electrical power of at least one of the first inverter and the second inverter such that applied voltage of the inverter-side connector is smaller than or equal to the step-up limit voltage and instructs the boost converter to perform the step-down operation such that the first DC power source is charged with the generated electrical power.

12. The drive system according to claim 1, further comprising:

a temperature acquirer that acquires a temperature of a target device including at least one of the first AC rotating electrical machine, the second AC rotating electrical machine, the first inverter, the second inverter, the third inverter, and the boost converter as a determination temperature, wherein a threshold for determining whether the target device is in an overheated state is set to be an overheat threshold, and when the determination temperature is determined to exceed the overheat threshold, the processor performs, as a process of changing the control state, a process of reducing the temperature of the target device by decreasing electrical power of the target device.

13. The drive system according to claim 1, further comprising:

a temperature acquirer that acquires a temperature of a target device including at least one of the first AC rotating electrical machine, the second AC rotating electrical machine, the first inverter, the second inverter, the third inverter, and the boost converter as a determination temperature, wherein, a threshold for determining the target device to be in a low-temperature state is set to be a low temperature threshold, and when the determination temperature is determined to fall below the low temperature threshold, the processor performs, as a process of changing the control state, a process of rising the temperature of the target device by increasing the electrical power of the target device.

14. A drive system including a first AC rotating electrical machine and a second AC electrical machine, the drive system comprising:

a first inverter electrically connected to the first AC rotating electrical machine and driving the first AC rotating electrical machine;

a second inverter electrically connected to a first end of the two ends of each phase coil constituting the second AC rotating electrical machine and driving the second AC rotating electrical machine;

a boost converter including a power-source-side connector electrically connectable to a first DC power source and electrically connected to an inverter-side connector electrically connected to the first inverter via a first electrical path and the second inverter via a second electrical path, the boost converter stepping up an output voltage of the first DC power source and outputting the stepped up output voltage to the first inverter and the second inverter; and a third inverter electrically connected to a second end side of the two ends of each phase coil constituting the second AC rotating electrical machine and driving the second AC rotating electrical machine by transmitting electrical power between the third inverter and a second DC power source different from the first DC power source, wherein the second DC power source and the first AC rotating electrical machine is configured to be connected via a single connecting path, the drive system further includes a processor that performs a process of changing a control state of at least one of the first inverter, the second inverter, the third inverter, and the boost converter based on the state of at least one of the first inverter, the second inverter, the third inverter, the boost converter, the first DC power source, and the second DC power source, wherein a threshold for determining an overdischarged state of the first DC power source is set to be a first overdischarge threshold, a threshold for determining an overcharged state of the second DC power source is set to be a second overcharge threshold, the processor acquires a first charging rate that is a charging rate of the first DC power source as a state of the first DC power source and a second charging rate that is a charging rate of the second DC power source as a state of the second DC power source, and when the processor determines that the first charging rate is smaller than or equal to the first overdischarge threshold and the second charging rate is smaller than the second overcharge threshold, the processor performs, as a process of changing the control state, a process of increasing generated electrical power fed from the first AC rotating electrical machine to the first inverter such that the first DC power source is charged with power generated at the first AC rotating electrical machine.

15. A drive system including a first AC rotating electrical machine and a second AC electrical machine, the drive system comprising:

a first inverter electrically connected to the first AC rotating electrical machine and driving the first AC rotating electrical machine;

a second inverter electrically connected to a first end of the two ends of each phase coil constituting the second AC rotating electrical machine and driving the second AC rotating electrical machine;

a boost converter including a power-source-side connector electrically connectable to a first DC power source and electrically connected to an inverter-side connector electrically connected to the first inverter via a first electrical path and the second inverter via a second electrical path, the boost converter stepping up an output voltage of the first DC power source and outputting the stepped up output voltage to the first inverter and the second inverter; and a third inverter electrically connected to a second end side of the two ends of each phase coil constituting the second AC rotating electrical machine and driving the second AC rotating electrical machine by transmitting electrical power between the third inverter and a second DC power source different from the first DC power source, wherein the second DC power source and the first AC rotating electrical machine are configured to be connected via a single connecting path, the drive system further includes a processor that performs a process of changing a control state of at least one of the first inverter, the second inverter, the third inverter, and the boost converter based on the state of at least one of the first inverter, the second inverter, the third inverter, the boost converter, the first DC power source, and the second DC power source, a threshold for determining an overcharged state of the first DC power source is set to be a first overcharge threshold, a threshold for determining an overdischarged state of the second DC power source is set to be a second overdischarge threshold, the processor acquires a first charging rate that is a charging rate of the first DC power source as a state of the first DC power source and a second charging rate that is a charging rate of the second DC power source as a state of the second DC power source, and when the processor determines that the first charging rate is larger than or equal to the first overcharge threshold and the second charging rate is smaller than or equal to the second overdischarge threshold, the processor performs, as a process of changing the control state, a process of increasing electrical power fed from the second inverter to the second AC rotating electrical machine and increasing generated power fed from the second AC rotating electrical machine to the third inverter such that the second DC power source is charged with electrical power discharged from the first DC power source.

16. A drive system including a first AC rotating electrical machine and a second AC electrical machine, the drive system comprising:

a first inverter electrically connected to the first AC rotating electrical machine and driving the first AC rotating electrical machine;

a second inverter electrically connected to a first end of the two ends of each phase coil constituting the second AC rotating electrical machine and driving the second AC rotating electrical machine;

a boost converter including a power-source-side connector electrically connectable to a first DC power source and electrically connected to an inverter-side connector electrically connected to the first inverter via a first electrical path and the second inverter via a second electrical path, the boost converter stepping up an output voltage of the first DC power source and outputting the stepped up output voltage to the first inverter and the second inverter; and a third inverter electrically connected to a second end side of the two ends of each phase coil constituting the second AC rotating electrical machine and driving the second AC rotating electrical machine by transmitting electrical power between the third inverter and a second DC power source different from the first DC power source, wherein the second DC power source and the first AC rotating electrical machine is configured to be connected via a single connecting path, the drive system further includes a processor that performs a process of changing a control state of at least one of the first inverter, the second inverter, the third inverter, and the boost converter based on the state of at least one of the first inverter, the second inverter, the third inverter, the boost converter, the first DC power source, and the second DC power source, wherein a threshold for determining an overcharged state of the first DC power source is set to be a first overcharge threshold, a threshold for determining an overdischarged state of the second DC power source is set to be a second overdischarge threshold, the processor acquires a first charging rate that is a charging rate of the first DC power source as a state of the first DC power source and a second charging rate that is a charging rate of the second DC power source as a state of the second DC power source; and when the processor determines that the first charging rate is larger than or equal to the first overcharge threshold and the second charging rate is larger than the second overdischarge threshold, the processor performs, as a process of changing the control state, at least one of a process of decreasing generated electrical power fed from the first AC rotating electrical machine to the first inverter such that the electrical power is discharged from the first DC power source and a process of increasing electrical power fed from the second inverter to the second AC rotating electrical machine such that electrical power is discharged from the first DC power source.

17. A drive system including a first AC rotating electrical machine and a second AC electrical machine, the drive system comprising:

a first inverter electrically connected to the first AC rotating electrical machine and driving the first AC rotating electrical machine;

a second inverter electrically connected to a first end of the two ends of each phase coil constituting the second AC rotating electrical machine and driving the second AC rotating electrical machine;

a boost converter including a power-source-side connector electrically connectable to a first DC power source and electrically connected to an inverter-side connector electrically connected to the first inverter via a first electrical path and the second inverter via a second electrical path, the boost converter stepping up an output voltage of the first DC power source and outputting the stepped up output voltage to the first inverter and the second inverter; and a third inverter electrically connected to a second end side of the two ends of each phase coil constituting the second AC rotating electrical machine and driving the second AC rotating electrical machine by transmitting electrical power between the third inverter and a second DC power source different from the first DC power source, wherein, the second DC power source and the first AC rotating electrical machine being configured to be connected via a single connecting path, the drive system further including a processor that performs a process of changing a control state of at least one of the first inverter, the second inverter, the third inverter, and the boost converter based on the state of at least one of the first inverter, the second inverter, the third inverter, the boost converter, the first DC power source, and the second DC power source, a threshold for determining an overdischarged state of the first DC power source is set to be a first overdischarge threshold, and a threshold for determining an overcharged state of the first DC power source larger than the first overdischarge threshold is set to be a first overcharge threshold, a threshold for determining an overcharged state of the second DC power source is set to be a second overcharge threshold, the processor acquires a first charging rate that is a charging rate of the first DC power source as a state of the first DC power source and a second charging rate that is a charging rate of the second DC power source as a state of the second DC power source, and when the processor determines that the first charging rate is larger than the first overdischarge threshold and smaller than the first overcharge threshold and that the second charging rate is larger than or equal to the second overcharge threshold, the processor performs, as a process of changing the control state, a process of decreasing electrical power fed from the second inverter to the second AC rotating electrical machine and increasing electrical power fed from the third inverter to the second AC rotating electrical machine such that the second DC power discharges electrical power.

18. A drive system including a first AC rotating electrical machine and a second AC electrical machine, the drive system comprising:

a first inverter electrically connected to the first AC rotating electrical machine and driving the first AC rotating electrical machine;

a second inverter electrically connected to a first end of the two ends of each phase coil constituting the second AC rotating electrical machine and driving the second AC rotating electrical machine;

a boost converter including a power-source-side connector electrically connectable to a first DC power source and electrically connected to an inverter-side connector electrically connected to the first inverter via a first electrical path and the second inverter via a second electrical path, the boost converter stepping up an output voltage of the first DC power source and outputting the stepped up output voltage to the first inverter and the second inverter; and a third inverter electrically connected to a second end side of the two ends of each phase coil constituting the second AC rotating electrical machine and driving the second AC rotating electrical machine by transmitting electrical power between the third inverter and a second DC power source different from the first DC power source, wherein, the second DC power source and the first AC rotating electrical machine are configured to be connected via a single connecting path, the drive system further includes a processor that performs a process of changing a control state of at least one of the first inverter, the second inverter, the third inverter, and the boost converter based on the state of at least one of the first inverter, the second inverter, the third inverter, the boost converter, the first DC power source, and the second DC power source, wherein a threshold for determining an overdischarged state of the first DC power source is set to be a first overdischarge threshold, and a threshold for determining an overcharged state of the first DC power source larger than the first overdischarge threshold is set to be a first overcharge threshold, a threshold for determining an overdischarged state of the second DC power source is set to be a second overdischarge threshold, the processor acquires a first charging rate that is a charging rate of the first DC power source as a state of the first DC power source and a second charging rate that is a charging rate of the second DC power source as a state of the second DC power source, and when the processor determines that the first charging rate is larger than the first overdischarge threshold and smaller than the first overcharge threshold and that the second charging rate is smaller than or equal to the second overdischarge threshold, the processor performs, as a process of changing the control state, a process of increasing generated electrical power fed from the second AC rotating electrical machine to the third inverter such that the second DC power is charged with electrical power generated by the second AC rotating electrical machine.

19. A drive system including a first AC rotating electrical machine and a second AC electrical machine, the drive system comprising:

a first inverter electrically connected to the first AC rotating electrical machine and driving the first AC rotating electrical machine;

a second inverter electrically connected to a first end of the two ends of each phase coil constituting the second AC rotating electrical machine and driving the second AC rotating electrical machine;

a boost converter including a power-source-side connector electrically connectable to a first DC power source and electrically connected to an inverter-side connector electrically connected to the first inverter via a first electrical path and the second inverter via a second electrical path, the boost converter stepping up an output voltage of the first DC power source and outputting the stepped up output voltage to the first inverter and the second inverter; and a third inverter electrically connected to a second end side of the two ends of each phase coil constituting the second AC rotating electrical machine and driving the second AC rotating electrical machine by transmitting electrical power between the third inverter and a second DC power source different from the first DC power source, wherein the second DC power source and the first AC rotating electrical machine are configured to be connected via a single connecting path, the drive system further includes:

a processor that performs a process of changing a control state of at least one of the first inverter, the second inverter, the third inverter, and the boost converter based on the state of at least one of the first inverter, the second inverter, the third inverter, the boost converter, the first DC power source, and the second DC power source;

a voltage setter that sets the voltage of the inverter-side connector of the boost converter to each voltage candidate value; and a loss calculator that calculates a loss presumed to occur in at least one of the boost converter, the first inverter, the second inverter, the third inverter, the first AC rotating electrical machine, and the second AC rotating electrical machine when the voltage of the inverter-side connector is the voltage candidate value set by the voltage setter, and the processor performs, as a process of changing the control state, a process of setting the voltage candidate value corresponding to the minimum loss among the losses calculated by the loss calculator for each voltage candidate value to be a converter voltage command value and controlling the boost converter such that the voltage of the inverter-side connector approaches the boost converter voltage command value.

20. A drive system including a first AC rotating electrical machine and a second AC electrical machine, the drive system comprising:

a first inverter electrically connected to the first AC rotating electrical machine and driving the first AC rotating electrical machine;

a second inverter electrically connected to a first end of the two ends of each phase coil constituting the second AC rotating electrical machine and driving the second AC rotating electrical machine;

a boost converter including a power-source-side connector electrically connectable to a first DC power source and electrically connected to an inverter-side connector electrically connected to the first inverter via a first electrical path and the second inverter via a second electrical path, the boost converter stepping up an output voltage of the first DC power source and outputting the stepped up output voltage to the first inverter and the second inverter; and a third inverter electrically connected to a second end side of the two ends of each phase coil constituting the second AC rotating electrical machine and driving the second AC rotating electrical machine by transmitting electrical power between the third inverter and a second DC power source different from the first DC power source, wherein the second DC power source and the first AC rotating electrical machine are configured to be connected via a single connecting path, the drive system further includes a processor that performs a process of changing a control state of at least one of the first inverter, the second inverter, the third inverter, and the boost converter based on the state of at least one of the first inverter, the second inverter, the third inverter, the boost converter, the first DC power source, and the second DC power source, wherein a ratio of the voltage of the power-source-side connector to a voltage of the inverter-side connector is defined to be a step-up ratio of the boost converter, a step-up limit voltage is smaller than a possible maximum value of an applied voltage of the inverter-side connector, the step-up limit voltage being the product of a possible maximum value of the step-up ratio of the boost converter and a possible maximum value of output voltage of the first DC power source, and when generated electrical power is fed from one of the first AC rotating electrical machine and the second AC rotating electrical machine to the other one, the processor performs, as a process of changing the control state, a process of stopping an operation of the boost converter when the applied voltage of the inverter-side connector exceeds the step-up limit voltage.

\* \* \* \* \*